US012079082B2

(12) United States Patent
Laurent et al.

(10) Patent No.: US 12,079,082 B2
(45) Date of Patent: Sep. 3, 2024

(54) METHODS AND SYSTEMS FOR MANAGING MEMORY WITH DYNAMIC ECC PROTECTION

(71) Applicant: Micron Technology, Inc., Boise, ID (US)

(72) Inventors: Christophe Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/801,992

(22) PCT Filed: Mar. 2, 2021

(86) PCT No.: PCT/IB2021/020009
§ 371 (c)(1),
(2) Date: Sep. 9, 2022

(87) PCT Pub. No.: WO2022/185089
PCT Pub. Date: Sep. 9, 2022

(65) Prior Publication Data
US 2024/0211346 A1 Jun. 27, 2024

(51) Int. Cl.
*G06F 11/00* (2006.01)
*G06F 11/10* (2006.01)

(52) U.S. Cl.
CPC ................ *G06F 11/1076* (2013.01)

(58) Field of Classification Search
None
See application file for complete search history.

(56) References Cited

U.S. PATENT DOCUMENTS

| 5,986,592 | A * | 11/1999 | Nakagawa ......... G11B 20/1426 341/94 |
| 7,222,284 | B2 * | 5/2007 | Stolpman .............. H04L 1/0057 714/774 |
| 9,128,858 | B1 * | 9/2015 | Micheloni ......... H03M 13/3707 |
| 10,261,707 | B1 | 4/2019 | Chaichanavong et al. |
| 2010/0318877 | A1 | 12/2010 | Amato et al. |

(Continued)

OTHER PUBLICATIONS

International Search Report and Written Opinion from related International Patent Application No. PCT/IB2021/020009, dated Nov. 18, 2021, 9 pages.

*Primary Examiner* — Mujtaba M Chaudry
(74) *Attorney, Agent, or Firm* — Brooks, Cameron & Huebsch, PLLC

(57) ABSTRACT

The present disclosure relates to a method comprising the steps of defining a minimum number of parity cells for storing parity data, the minimum number of parity cells corresponding to a minimum Error Correction Code (ECC) correction capability, defining a maximum number of parity cells for storing the parity data, the maximum number of parity cells corresponding to a maximum ECC correction capability, storing payload content in a plurality of memory cells of a memory array, and, based on a current status of the memory cells storing the payload, selecting a number of parity cells to be used for storing the parity data between the minimum number and the maximum number. The payload is stored in at least part of the parity cells which are not selected to store parity data. Related memory devices and systems are also herein disclosed.

32 Claims, 13 Drawing Sheets

(56) References Cited

U.S. PATENT DOCUMENTS

| | | |
|---|---|---|
| 2013/0061113 A1 | 3/2013 | Kim et al. |
| 2014/0317468 A1* | 10/2014 | Kim ................. H03M 13/2909 |
| | | 714/758 |
| 2015/0074487 A1 | 3/2015 | Patapoutian et al. |
| 2016/0162352 A1* | 6/2016 | Singhai ............... G06F 11/1048 |
| | | 714/773 |
| 2018/0143871 A1* | 5/2018 | Shinbashi ........... H03M 13/095 |

* cited by examiner

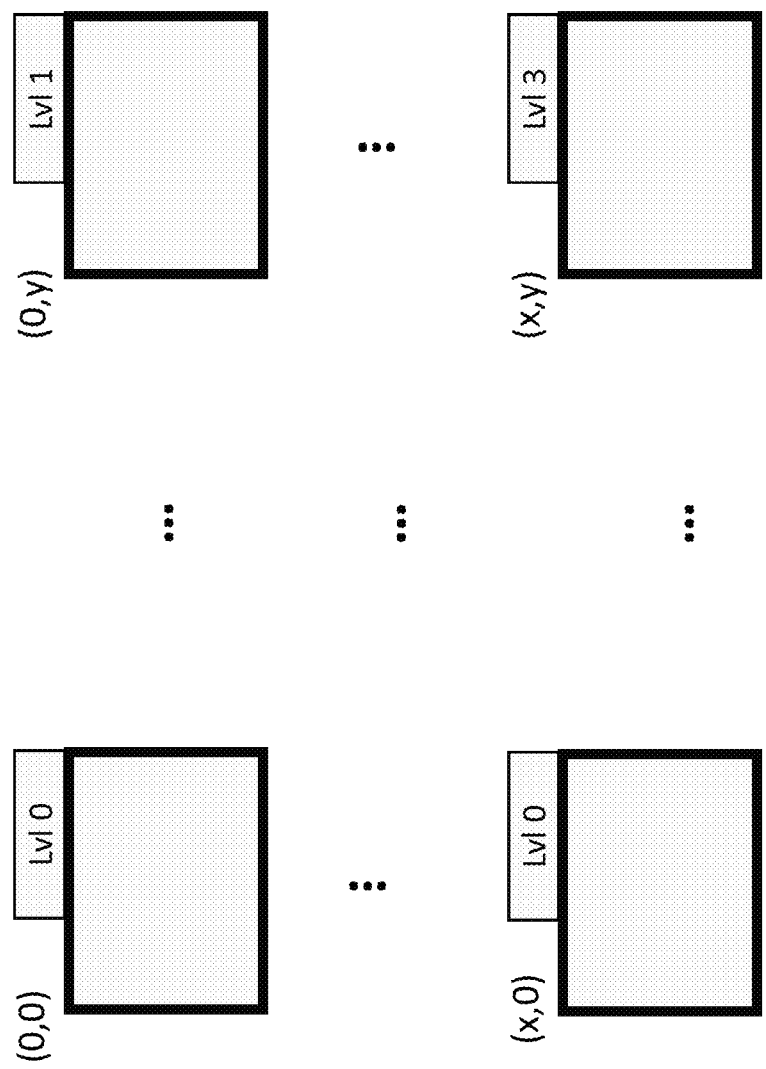

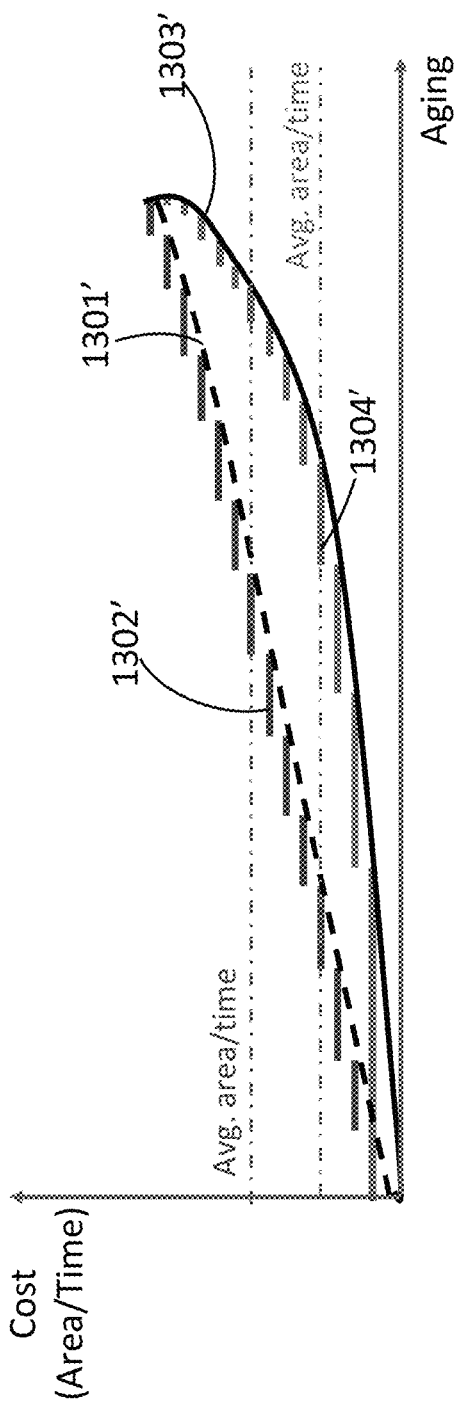
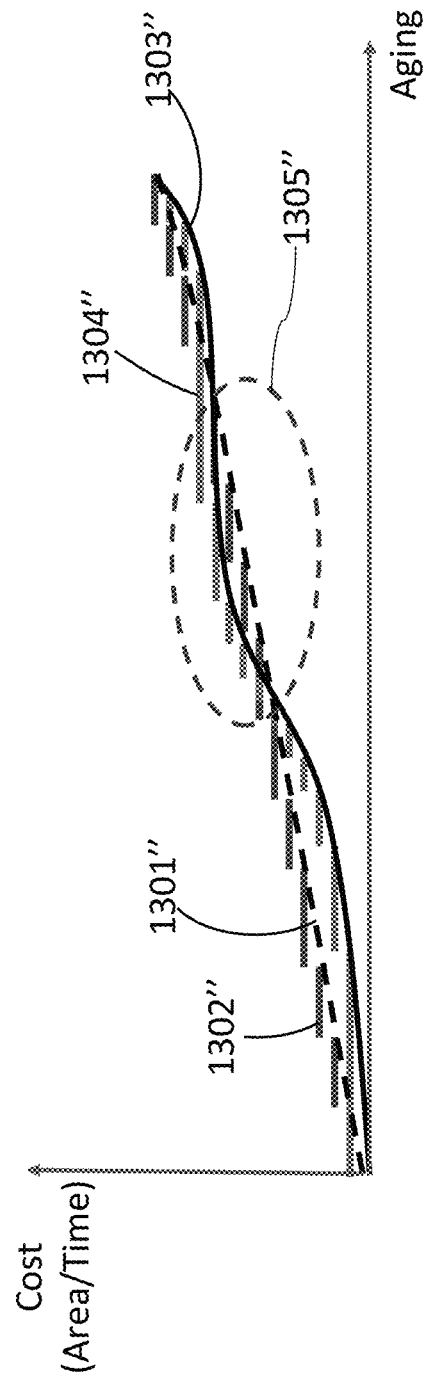
FIG. 13A
FIG. 13B

METHODS AND SYSTEMS FOR MANAGING MEMORY WITH DYNAMIC ECC PROTECTION

PRIORITY INFORMATION

This application is a National Stage Application under 35 U.S.C. § 371 of International Application Number PCT/IB2021/020009, filed on Mar. 2, 2021, the contents of which are incorporated herein by reference.

TECHNICAL FIELD

The present disclosure relates generally to the management and operation of an array of memory cells, and more particularly to methods and systems for improving the performances of memories having dynamic ECC protection.

BACKGROUND

Memory devices are used in many electronic systems such as mobile phones, personal digital assistants, laptop computers, digital cameras and the like. Various types of memories are used in memory devices, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, nonvolatile memory cells may maintain their stored logic state for extended periods of time even in the absence of an external power source.

The information is stored by programming different states of a memory device. For example, binary devices have two states, often denoted by a logic "1" or a logic "0." In other systems, more than two states may be stored. In order to access the stored information, a component of the memory device may read, or sense, the stored state. In order to store the information, a component of the memory device may write, or program, the logic state.

Improving memory devices may include increasing memory cell density, increasing read/write speed, increasing reliability, increasing data retention, reducing manufacturing costs, scaling smaller than traditional devices, as well as reducing power consumption.

Memory cells have varying physical and electrical characteristics during their life cycle due to various factors such as number of accesses, quality of the manufacturing process, environmental factors, and the like. Error Correction Code (ECC) is usually calibrated on a defined status of the cells of the memory device (e.g. end-of-life reliability of the cells), and therefore is generally used at its highest correction power. Consequently, there is often an excessive power consumption. It is thus desirable to improve power consumption performances over the entire life of the memory device.

BRIEF DESCRIPTION OF THE DRAWINGS

FIG. 12 schematically shows separate portions of a memory array subjected to a testing operation; and FIGS. 13A and 13B are schematic exemplary graphs representing cost of an implemented ECC protection level selection technique versus aging of the cells of the array.

DETAILED DESCRIPTION

With reference to those drawings, methods and systems for an improved operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Access circuitry can differentiate between different logic states of a memory cell. For example, in case of a memory read, the access circuitry applies a voltage pulse with a particular magnitude and polarity to access lines, which results in an electrical response that dedicated sense circuitry can detect. Detecting electrical responses can include, for example, detecting one or more of a voltage drop (e.g., a threshold voltage) across terminals of a given memory cell of the array, current through the given memory cell, and a threshold event of the given memory cell.

In the present disclosure, the term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

Figure 1:
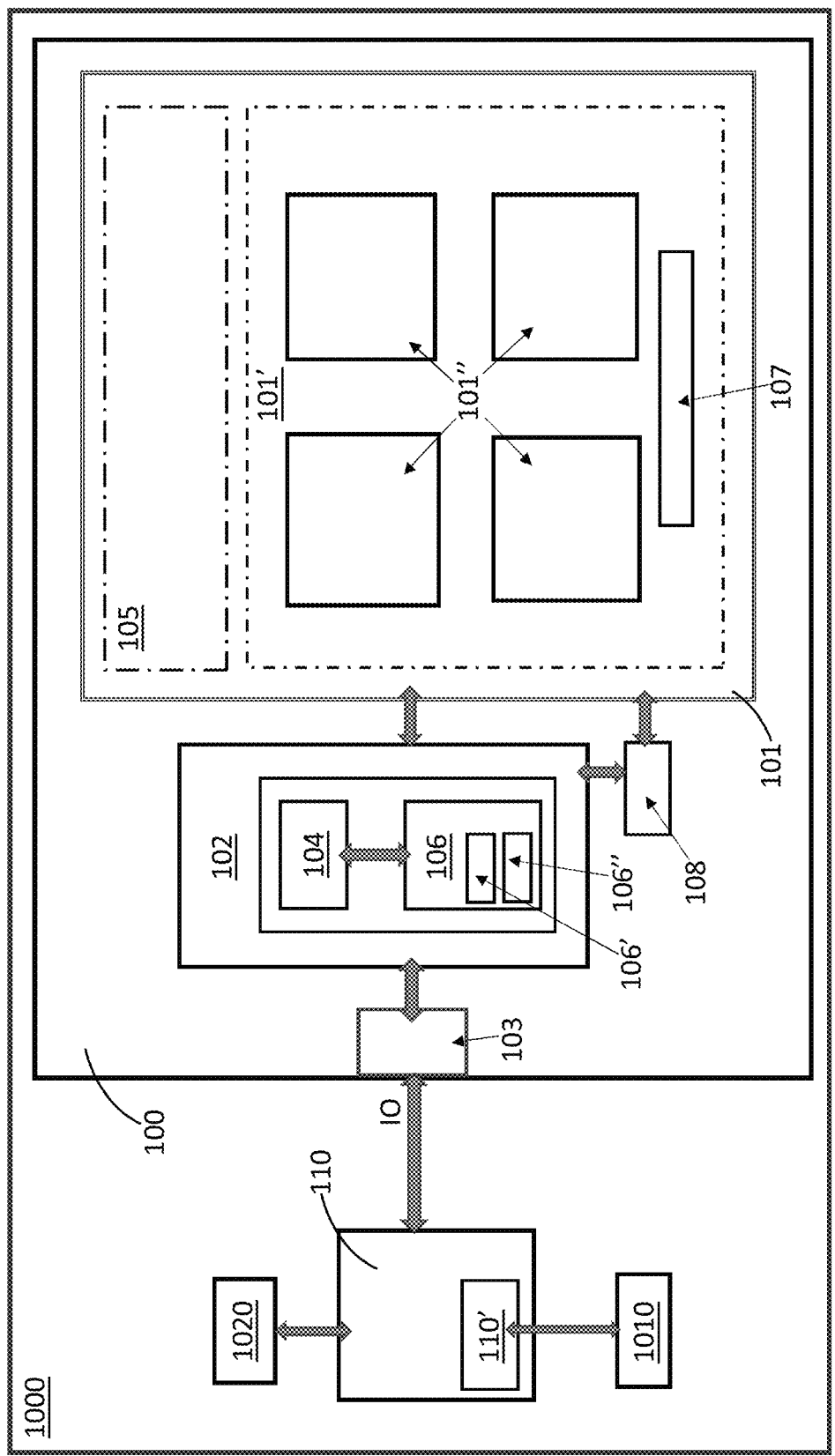
FIG. 1 is a schematic block diagram of a system comprising a memory device that may be operated according to the present disclosure.

FIG. 1 is a schematic high-level block diagram of a system 1000 comprising a memory device 100 according to an exemplary embodiment of the present disclosure, this memory device 100 being programmed to perform the ECC techniques disclosed below.

The memory device 100 can be a solid-state drive (SSD), for instance, and can include a memory section 101, a controller 102, and a host interface 103. The memory section 101 is not limited to a particular architecture and can include different types of memories.

The controller 102 may be coupled to the host interface 103 and to the memory section 101 via a plurality of channels and can be used to transfer data between the memory section 101 and a host 110. The host interface 103 can be in the form of a standardized interface. For example, when the memory device 100 is used for data storage in a computing system, the host interface 103 can be a serial advanced technology attachment (SATA), peripheral component interconnect express (PCIe), or a universal serial bus (USB), among other connectors and interfaces. In general, the host interface 103 can provide an interface for passing control, address, data, and other signals between the memory device 100 and the host 110.

The controller 102 can include an embedded firmware and is adapted to internally manage and control the operation of the memory section 101. The controller 102 can communicate with the memory section 101 to control data read, write, and erase operations, among other operations. For example, the controller 102 can include a number of components in the form of hardware and/or firmware (e.g., one or more integrated circuits) and/or software for controlling access to the memory section 101 and/or for facilitating data transfer between the host 110 and said memory section 101.

The memory controller 102 thus represents control logic of the device, for example acting in response to command by the host 110 (which may generally be an external managing system of the non-volatile memory). As will be disclosed in the following, in one embodiment, the memory controller 102 can also be implemented in the host 110, in particular as part of a host processor 110', even if the present disclosure is not limited by a particular architecture.

As disclosed in relation to FIG. 1, the memory controller 102 may receive user data through input/output IO. Multiple signal lines couple the memory controller 102 with the memory section 101. For example, such signal lines may include clock, command/address and write data (DQ), read DQ, and zero or more other signal lines. The memory controller 102 may thus be operatively coupled to the memory section 101 via suitable buses.

The memory device 100 can also comprise other components (not shown) such as processor units coupled to the controller 102, antennas, further connection means with the host device 110, and the like. In any case, the present disclosure is not limited by a specific configuration of the memory device 100.

Moreover, the controller 102 can also include its own memory section (not shown) operatively coupled with other units thereof. In any case, the present disclosure is not limited by a particular configuration of the controller 102.

The memory device 100 may be a portable device configured to be coupled to the host device 110. However, in other embodiments not shown in the drawings, the memory device 100 can also be embedded within one or more host devices. The host 110 may be for example a personal computer, a tablet, a smartphone, a server or the like. The host 110 can include a system motherboard and/or backplane and can include a number of memory access devices (e.g., a number of processors).

In an embodiment, the controller 102 includes an Error Correction Code (ECC) unit 104, also referred to as ECC engine, which is configured to operate according to techniques described in the following.

The ECC unit 104 can include error correction circuitry to detect and correct a number of bit errors, according to embodiments of the present disclosure. The ECC unit 104 is not limited to circuitry (e.g., hardware) implementations. For instance, the ECC unit 104 can be implemented in hardware, firmware, and/or software.

The ECC unit 104 can be embodied by discrete components such as an application specific integrated circuit (ASIC) or by components that reflect functionally provided by circuitry within the controller 102 that does not necessarily have a discrete physical form separate from other portions of the controller 102. Although illustrated as components within the controller 102, the ECC unit 104 can be external to the controller 102 or can have a number of components located within the controller 102 and a number of components located external to the controller 102, wherein the present disclosure is not limited by a specific hardware architecture. The ECC unit 104 can include separate encoding and decoding components, in a number of embodiments. In general, the memory device 100 thus comprises an operating unit which is an ECC engine coupled to the controller 102.

In other words, the error detection/correction circuitry of the ECC unit 104, which may be programmed as disclosed below, can include hardware logic to implement an ECC to detect errors occurring in data read from memory section 101. In one embodiment, error detection/correction circuitry also corrects errors (up to a certain error rate based on the implemented ECC code).

The memory section 101 of the memory device 100 can be a flash memory including an array of memory cells, for example a NAND memory, NOR memory, AND memory, and the like. Additionally or alternatively, memory section 101 may comprise bit alterable memory cells; for example, Phase Change Memory (PCM), Ferroelectric Memory (FeRAM), Magnetic Memory (MRAM), chalcogenide-based Self Selecting Memory (SSM), etc. Any kind of memory may be employed in embodiments of the present disclosure. For example, the disclosure applies to either or both non-volatile and volatile memories.

In general, the memory section 101 may comprise an array of memory cells 101'. Non-volatile memories may comprise a plurality of blocks, each block being indicated herein with the reference number 101" and comprising a defined number of pages. For the sake of simplicity, only four blocks 101" are shown in the example of FIG. 1.

The memory section 101 represents the memory resource for the memory device 100. In one embodiment, the array of memory cells 101' is managed as rows of data, accessed via wordline (rows) and bitline (individual bits within a row)

control. The array of memory cells 101' can be organized as separate channels, ranks, and banks of memory, in general in a plurality of portions, as previously disclosed. Channels are independent control paths to storage locations within memory section. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In other words, according to an embodiment of the present disclosure, the array of memory cells 100' may be subdivided into a plurality portions, such as a page, a single block, a group of blocks, or even all blocks (i.e. all the cells), the invention not being limited thereto. The memory cells can thus be grouped, for instance, into a number of blocks including a number of physical pages. A number of blocks can be included in a plane of memory cells and an array can include a number of planes.

Embodiments are not limited to a particular type of memory array or array architecture and the techniques of the present disclosure may be applied to several memory technologies (e.g., planar, cross-point, 3D, etc.).

Memory section 101 may also comprise a circuit portion 105 operatively coupled to the array of memory cells 101'.

In one embodiment, the circuit portion 105 includes access circuitry and sense circuitry to detect electrical responses of the one or more memory cells to an applied read voltage. In one embodiment, the sense circuitry includes sense amplifiers. FIG. 1 illustrates the circuit portion 105 as being embedded in the memory section 101; however, other embodiments can include access circuitry and/or sense circuitry that is separate from the memory section 101. For example, access circuitry and sense circuitry can be included in a memory controller such as the memory controller 102.

Furthermore, the memory device 100 may comprise a counting unit 106 configured to account for the status of the memory cells of the array of memory cells 101' and for determining a trigger event to activate the ECC unit 104.

More in particular, the counting unit 106 may comprise a first counter 106' and a second counter 106". The first counter 106' may be configured to account for the lifetime of the array of memory cells 101' (or of portions thereof), as it will be disclosed below. For example, the first counter 106' may be apt to count the number of accesses, or the number of refresh events, or the number of power-up events, or a combination thereof, in accordance with embodiments disclosed below. The second counter 106" may be configured to count the number of errors detected by the ECC unit 104, in accordance with embodiments disclosed below.

In the example of FIG. 1, the counting unit 106 is depicted as integrated into the controller 102, even if other architectures are possible and the counting unit 106 may also be external to the controller 102 and connected thereto, or it may be integrated in the ECC unit 104.

Furthermore, the memory device 100, in particular the array of memory cells 101' of the memory section 101, may comprise a non-volatile region 107 apt to store operating information, for example for the management of the memory array according to embodiments disclosed in the following.

In one embodiment, the memory device 100 may also comprise a sensing unit 108 comprising one or more sensors operatively coupled to the memory section 101 and optionally to the controller 102. The sensing unit 108 may be configured to detect a status (e.g. the temperature) of the array of memory cells 101' or of a portion thereof.

Generally, the particular architecture of the memory device 100 may vary according to the needs and/or circumstances without limiting the scope of the present disclosure.

The host 110 and the memory device 100 may form a system 1000. As mentioned before, the host device 110 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The host 110 may generally be a system managing the memory section 101, which may be embedded in said system or generally managed by said system. The memory device 100 may thus be managed by an external controller, i.e. the controller embedded in the processor 110' of the host 110, as previously disclosed, so that the ECC unit may also be included in said external controller. In this case, the controller of the memory device may not be present and the memory device 100 (which may be embedded in the host 110) communicates the required information to the external controller.

In one embodiment, the system 1000 includes an interface 1010 coupled to the processor 110', which can represent a higher speed interface or a high throughput interface for system components that needs higher bandwidth connections, and/or graphics interface components. Graphics interface interfaces to graphics components for providing a visual display to a user of system 1000. In one embodiment, graphics interface generates a display based on data stored in the memory device or based on operations executed by processor or both.

The system may also comprise network interface 1020 communicatively coupled to the host or to memory device for example for connecting with other systems, and/or a battery coupled to provide power to said system.

According to the present disclosure, the ECC unit 104 may be configured to perform an ECC operation (detection and/or correction of errors) with a certain error correction capability on a codeword stored in the memory section 101, wherein the codeword includes a certain number of parity bits, as it will be disclosed in the following. The ECC capability may vary dynamically with time for a given memory portion, requiring a correspondingly varying number of selected parity cells between a minimum and a maximum (respectively associated with a smallest and a largest ECC capability for the payload). The payload may be stored in at least part of the parity cells which are not selected to store parity data. At ECC capability changes, possibly triggered based on a varied status of memory cells, unused parity cells are made available for storing ECC information and the payload stored therein may be relocated.

Figure 2:
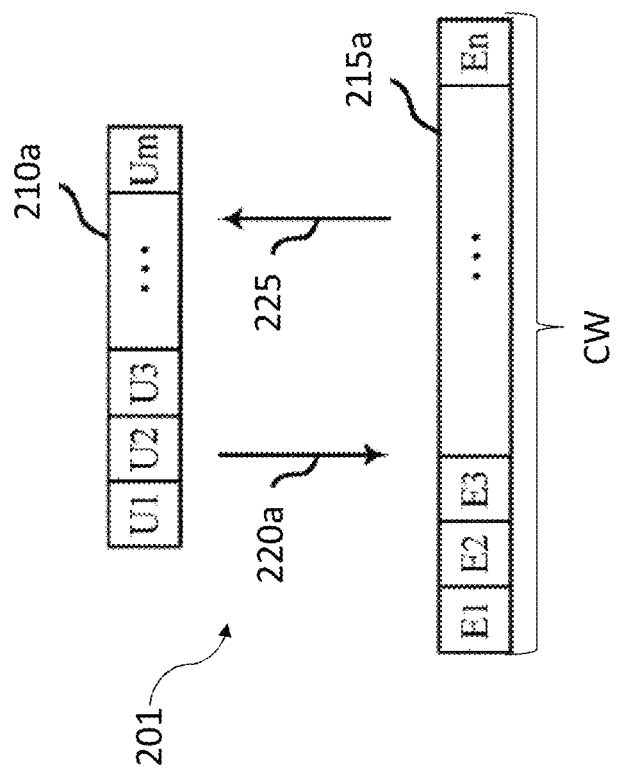
FIG. 2 is an example of user data pattern encoded according to embodiments of the present disclosure.

FIG. 2 illustrates an exemplary user data pattern diagram 201. The user data pattern diagram 201 includes user data 210a and encoded user data 215a. Encoding process 220a, which is performed in the programming phase of the array of memory cells, may convert the user data 210a (U1, ..., Um) into the encoded user data 215a (E1, ..., En). The encoded user data 215a may be stored in a set of memory cells, which may be, for example, memory cells of the memory section 101 of FIG. 1. Each box of the encoded user data 215a may correspond to a memory cell that may exhibit a logic state of 1 or a logic state of 0. In embodiments of the present disclosure, during the encoding process 220a, a number of parity bits may be added to the user data (or payload) 210a. A number of bits in the encoded user data 215a may be greater than the number of bits in the user data 210a (e.g., n is larger than m if some bits, e.g., parity bits, are added). Process 225 may convert the encoded user data 215a back to the user data 210a after the encoded user data 215a have been accurately read.

In an embodiment, the plurality of encoded bits to be read represents a codeword (CW). The codeword may be programmed to include various information to be used during the reading phase. In order to keep a smooth and simple description, in the following, reference will be made to ECC-related information only. It is understood that the additional bits may include not strictly ECC-related information, though. Examples may include encryption bits, scrambling bits, bits for balanced or quasi-balanced codes (e.g., to achieve a predefined percentage, or within a percentage range, of bits in a given logic state, such as 50% of 1s or 0s), and/or other purpose additional bits.

As mentioned before, when digital data are stored in non-volatile memory (such as the array of memory cells 101' of FIG. 1), data are encoded in such a way that a decoder can identify and correct errors, i.e. data strings are encoded by adding a number of parity bits. When the original data is to be reconstructed, the decoder examines the encoded message to check for any errors. In certain embodiments, a block of user data bits is encoded to become a block of n bits (i.e. the codeword CW), as shown in FIG. 2. However, various encoding schemes are possible.

During the lifetime of the memory array, the Bit Error Rate (BER) associated to the data stored in the memory cells evolves based on several factors, such as, for example, a number of accesses to the memory cells, process quality, environment (space, power supply voltage, operating and storage temperature, etc.), and the like. For some technologies, the BER is typically better at the beginning of the die life and worst at the end of life, while, for some others, the BER could be better after some cycles than at the beginning and at the end of life of the die.

The present disclosure provides systems and methods to tailor the evolution of the BER and to enable a lower ECC protection when the BER is low and to increase said protection when the BER is higher. In other words, the present disclosure provides a technique to precisely define the ECC correction capability (or ECC protection level) to be applied to the cells of a memory array according to the status thereof. In the context of the present disclosure, the "status" of a cell is meant as its operating condition or generally its health. As mentioned above, often the status of a memory cell or a of plurality of memory cells may depend on several present and past parameters. The principles of the present disclosure may be applied to several types of volatile or non-volatile memories which show a time-varying status of their memory cells.

On the basis of the encoding scheme, a codeword is generated (process 220a) by manipulating the user data bits and adding a number of parity bits, the number of added parity bits depending on the ECC correction capability (the more potential errors are to be detected and corrected, the more parity bits are necessary). The ECC unit 104 may generate the codeword according to the selected ECC protection level. According to the disclosure, the ECC protection level and the number of additional parity bits (which are intrinsically tied) may vary in operation. Based on the decoding scheme, an ECC syndrome is produced from the encoded set of user and parity data, for instance by means of the ECC unit 104 of FIG. 1. The ECC syndrome changes depending on the presence and location of errors. When errors are detected, the ECC unit 104 is able to correct said errors up to and according to the implemented correction capability. In some cases, the presence of an uncorrectable error (e.g., the location of which is unknown) may be reported.

The number of used parity bits and the ECC correction capability are, therefore, intrinsically tied to each other. When programming a data into memory, the desired level of ECC protection level (correction capability) can be selected and a corresponding number of parity bits allocated for storing the parity information. Unused parity bit cells may be allocated for (additional, e.g., extra) payload storage. According to some embodiments, payload may be increased when a lower ECC correction capability is used. When ECC correction capability is possibly increased, for example based on an increase of cells' aging or failure rate, the memory cells for storing the more parity bits needed are reclaimed and the payload stored therein is relocated.

At read back, the codeword (e.g., including user codeword data, additional or extra payload data stored in unused parity bit cells, and parity bits used during the encoding phase) is accessed and decoded according to the ECC scheme applicable to that memory portion. An ECC engine (implemented in hardware, for example) with a given maximum ECC correction capability may operate at different correction capabilities each requiring a corresponding number of parity bits. For example, less or more parity bits may be considered either in encoding or decoding for a lower or higher ECC protection level, respectively; correspondingly, a smaller or higher power is consumed.

Figure 3:
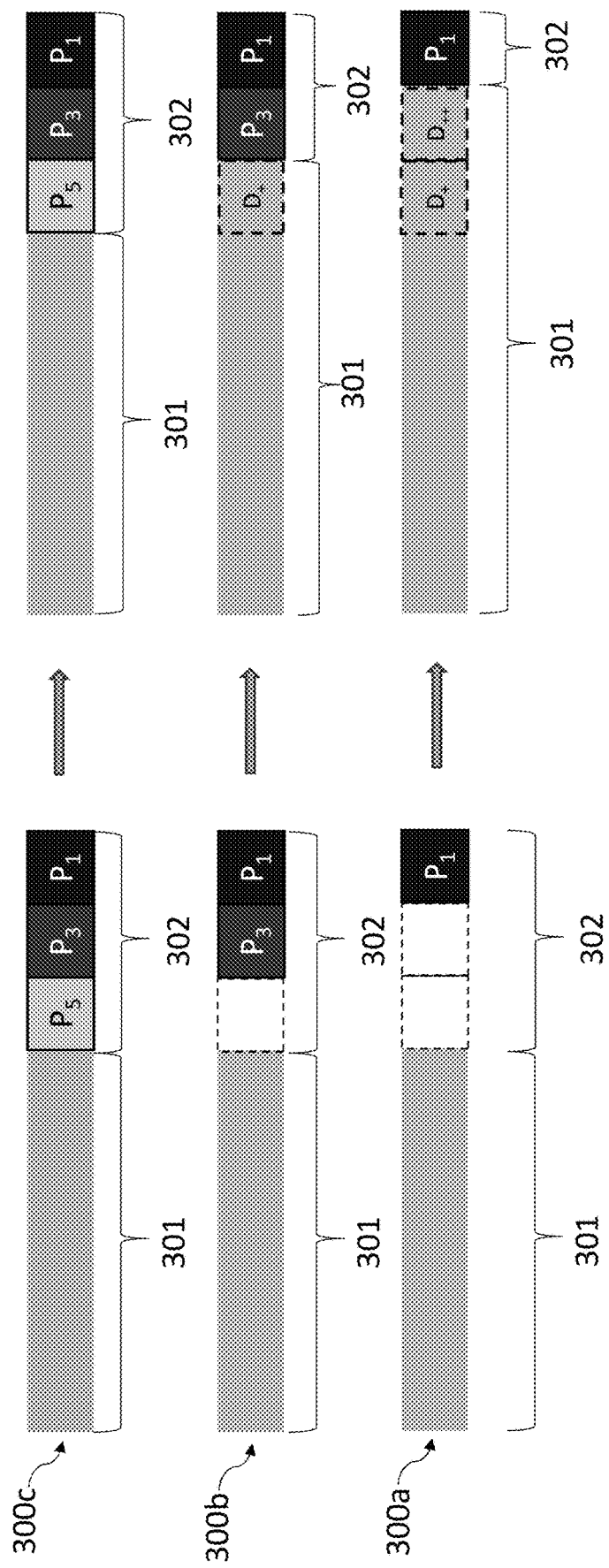
FIG. 3 shows examples of selection of a number of parity cells and payload quantity in a codeword according to embodiments to the present disclosure.

Referring now to FIG. 3, according to an embodiment of the present disclosure, the ECC protection level is selectable according to the status of the cells of the memory array. In other words, the ECC protection is adapted to the memory cell health and increased only when necessary, i.e. when the status of the cells requires it.

As shown before, when user data (i.e., the payload content of a codeword) are stored in a plurality of memory cells of the memory array, also parity data are stored in parity cells of the memory array associate with the user data. The number of used parity cells is selected based on the status of the plurality of memory cells, this selected number being related to the required ECC protection level, e.g., the desired or selected ECC correction capability. The ECC operation is then performed based on the selected number of parity cells, i.e., on the basis of the stored parity bits, which may vary according to the cell health.

More in particular, the used parity cells (i.e., the stored parity bits) are selected between a defined maximum number and a defined minimum number, so that the number of unused parity cells is given by the difference between the maximum defined number and the used number of parity cells. According to an embodiment, the unused parity cells (which are adapted to store parity bits corresponding to higher ECC protection levels) are used to store extra payload content.

In other words, when the payload is stored, parity data are associated to the payload; in particular, a minimum number of parity cells to be used is defined, the minimum number of parity cells corresponding to the minimum ECC correction capability, and a maximum number of parity cells to be used is defined, the maximum number of parity cells corresponding to the maximum ECC correction capability. Based on the current status of the memory cells storing the payload, the number of parity cells to be used for storing the parity data is selected between the minimum number and the maximum number. Memory cells that are not selected to store parity data (e.g., unselected parity data memory cells) are instead used for storing, at least in part, the payload; accordingly, more storage capability is provided.

As shown in FIG. 3, a codeword may comprise a first codeword portion 301 corresponding to the payload (thus including encoded user data), and a second codeword portion 302 corresponding to the parity data. It is noted that such a distinction may be somehow arbitrary; as a matter of fact, an encoding process (such as process 220a in FIG. 2) may combine and mix the user data and the parity data so that the codeword as a whole should be considered.

When a minimum ECC protection level is needed, only a reduced number of parity cells may be used, as in codeword 300a where only the cells indicated as $P_1$ are used to store parity bits (e.g., only a number of bits to calculate syndrome $S_1$ corresponding to ECC1 is stored, wherein ECC1 may be an error correction code with correction capability of 1 bit, in some examples).

When ECC protection has to be increased, an increased number of cells may be used, as in codeword 300b, where an increased number of parity bits ($P_1$ and $P_3$) is stored to calculate syndrome $S_1$ and $S_3$ (e.g., corresponding to ECC2, wherein ECC2 may be an error correction code with correction capability of 2 bits, in some examples).

When protection has to be at a maximum level, the number of used parity cells may be further increased, as in codeword 300c where an increased number of parity bits ($P_1$, $P_3$ and $P_5$) is stored to calculate syndrome $S_1$, $S_3$ and $S_5$ (e.g., corresponding to ECC3, wherein ECC3 may be an error correction code with correction capability of 3 bit, in some examples), occupying the maximum number of parity cells, e.g., all the memory cells available for storing parity data are used. It is observed that a single block of the codeword portion 302 does not necessary correspond to a single cell and may also corresponds to a group of cells, e.g., it generally represents the number of bits to calculate the syndrome for a corresponding ECC protection level. It should also be understood that, while three levels of protection are depicted in FIG. 3 (e.g., ECC1, ECC2 and ECC3), any number may be conceived. For example, embodiments with higher (e.g., N>3) error correction capability and/or embodiments featuring no ECC protection at all (e.g., no parity bits added to the codeword for the purpose of error correcting it) are possible.

The reduction of the ECC protection level to the minimum necessary thus corresponds to the reduction of the number of used parity cells.

The present disclosure provides systems and methods to tailor the evolution of the BER and to enable a lower ECC protection when the BER is low and to increase said protection when the BER is higher and storing (additional, e.g., extra) payload in unused parity bit memory cells. For example, the disclosure teaches storing a payload in a plurality of memory cells of a memory array, defining a minimum and a maximum number of parity cells for storing parity data associated to the payload (wherein the minimum and maximum number of parity cells respectively correspond to a minimum and maximum ECC correction capability), and, based on a current status of the memory cells, selecting a number of parity cells to be used for storing the parity data between the minimum number and the maximum number, wherein the payload is stored in at least part of the parity cells which are not selected to store parity data.

As an example, in some cases, at the start of life of the array, ECC1 may be used and, at end of life, ECC3 may be used (and therefore an increased number of parity cells may be used). However, also different cases are possible, including cases in which at the start of life a maximum ECC protection level is needed and after some cycles (e.g., after seasoning or in general after usage of memory cells), the ECC protection level may be reduced.

As shown in the left portion of FIG. 3, the number of unselected (unused) parity cells of codeword portion 302 is given by difference between the maximum number of parity cells to be used and the actual used number (e.g., $P_1$ in 300a, $P_1$ and $P_3$ in 300b and $P_1$, $P_3$ and $P_5$ in 300c. As shown in the right portion of FIG. 3, payload may then be stored in at least part of the parity cells which are not selected (e.g., used) to store parity data, identified with dashed border in 300a and 300b. In this way, the stored payload content is dynamically adapted in a codeword according to the selected number of parity cells, i.e., based on the selectable ECC protection. The dimension of the codeword portion 301 thus varies according to the selected ECC protection level, in particular within a fixed length page.

As shown in FIG. 3, if the ECC parity bits are stored in a reduced number of parity cells, e.g., when low ECC protection level is needed (as in codeword 300a where only parity cells $P_1$ are used), the payload can be larger, e.g., groups of cells indicated as $D_{+1}$ and $D_{+2}$ can be used for storing extra payload content. Moreover, if the ECC protection level is increased, as in codeword 300b, payload is decreased and only parity cells $D_{+1}$ can be used. Then, if the ECC protection level is maximum, as in codeword 300c, all the parity cells are used for storing parity bits and the payload content is minimum (i.e., codeword portions 301 of left and right sides of FIG. 3 have a same length). In this way, some parity cells are actually used as parity when a higher ECC protection level is required and as payload when lower ECC protection level is selected. Therefore, according to the present disclosure, when bits are stored in the memory cells forming a codeword, such codeword may exhibit a dynamic payload varying during die life, as the number of parity bits varies according to the selected ECC protection level.

For example, a maximum number of memory cells for storing the payload is used when the selected number of parity cells to be used is the minimum, and a minimum number of memory cells for storing the payload is used when the selected number of parity cells to be used is the maximum. In an embodiment, all the parity cells which are not used to store parity data are used to store extra payload content. However, in other embodiments, the memory may be programmed in such a way that the payload is stored only in a part of the unused parity cells.

The storage of extra payload content in unused parity cells has many benefits, since said unused cells are a cost in terms of area of the memory. The average available payload may be optimized according to the required reliability and is higher along the die life, as well as average read/write, refresh and wear levelling throughput are higher, as it will be shown in detail below.

The dynamic payload allows obtaining a time-changing available space for data storage in the device, with increased average memory capacity during lifetime. Moreover, the dynamic payload also leads to a power reduction due to the possibility to access fewer pages and to the possibility of using smaller ECC decoder, as well as to a possible delay reduction in buffer filling.

As observed with reference to FIG. 1, ECC circuitry may be integrated in the controller of the memory device, which is properly programmed to execute the ECC techniques of the present disclosure. More in particular, the controller may comprise circuit portions configured to perform the ECC operation (verify and correction of a determined number of bits error) on payload content according to the selected ECC correction capability. In an embodiment, the controller is configured to activate different circuit portions according to the selected ECC correction capability.

Furthermore, different portions of the array of memory cells may have a different status and/or may exhibit different defect densities. According to an embodiment of the present disclosure, the memory cells of the array may be grouped into a plurality of portions, each portion being assigned a specific ECC protection level based on the status of the memory cells thereof. Different portions may thus have different ECC protection levels as well as a same protection level, depending on the specific circumstances. A "portion" of the array is therefore a group of memory cells having the same ECC protection level. In other words, the array may be split into portions in which the ECC correction capability is coherent but could be different from the ECC correction capability of another portion.

According to an embodiment, a memory portion may correspond to an internal subdivision like a bank group, a bank, a section or whatever other suitable internal subdivision of the memory. Moreover, the memory portion may also correspond to a specification/host subdivision like a buffer, a page, i.e., a subdivision at high level. In an embodiment, the whole memory array may be coherent in term of ECC correction capability.

In other words, a portion may correspond to one of a codeword, a bank, a bank group, a section of the array, the entire array, or even a buffer, a page, and the present disclosure is not limited by the way the cells are grouped.

The subdivision of the array into several portions, possibly having different ECC protection levels, is better suited to real memory devices and has many benefits.

Figure 4B:
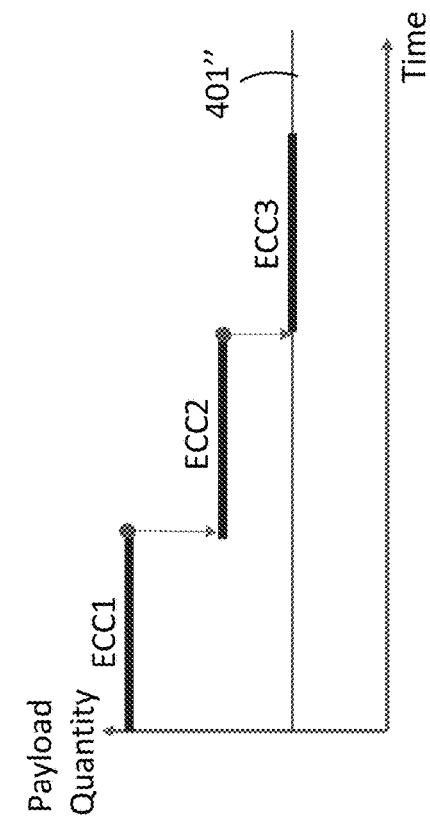
FIGS. 4A and 4B are graphs showing power consumption versus time and payload quantity versus time, respectively, as a result of techniques according to the present disclosure.
Figure 4A:
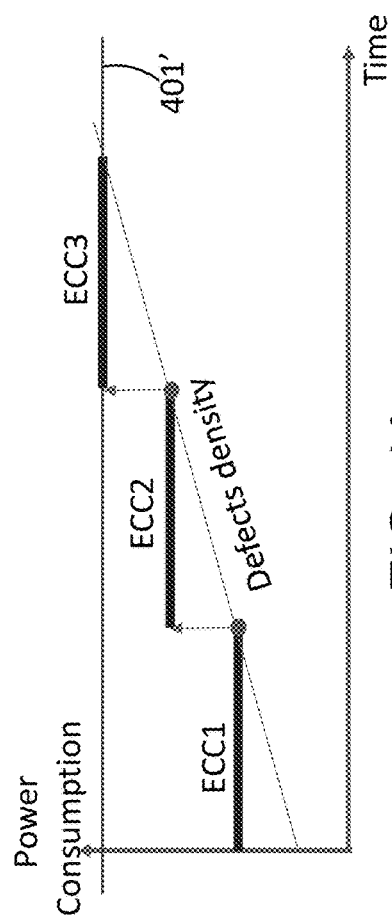

FIGS. 4A and 4B are graphs showing, on the Y axis, power consumption (or generally the cost of the ECC, FIG. 4A) and payload quantity (FIG. 4B) versus time, on the X axis, according to the present disclosure. It should be noted that, despite time is represented on the X-axis, the concepts herein disclosed are not limited to power consumption evolution vs. time and, rather, they apply to whichever factor that may potentially affect the Bit Error Rate of the memory cells (e.g., cycling, endurance, aging, exposure to high/low temperatures, hard/soft failure mechanisms, voltage drift, etc.; accordingly time is only one of many possible examples and the figures should be correspondingly broadly interpreted). In particular, in an example, the time increase may correspond to an increase in the defect density, as shown in FIG. 4A. The ECC protection level may then be varied during the life of the memory array; specifically, FIG. 4A is an example of a single portion of the array in which the starting protection level is low (e.g., ECC1, corresponding to a low power consumption), this starting ECC protection level being increased over time based on the increase in the defect density, e.g., the bit error rate. It is also possible a situation (not shown in the drawings) in which the ECC protection level is lowered over time, depending on the specific technology of the memory. Line 401' of FIG. 4A represents the prior art average cost in terms of consumed power corresponding to the number of used parity cells (e.g., $P_1$, $P_3$ and $P_5$ in case of ECC3, as depicted in FIG. 3), which is always at a maximum level, while according to the present disclosure the average power cost may be significantly reduced, since for a significant period of time the ECC protection level is not at maximum level. As shown in FIG. 4B, when a minimum ECC correction capability is selected (ECC1 at beginning of life, for example—only requiring $P_1$ parity cells, as depicted in FIG. 3), there are unused parity cells available for storing payload that may be increased (e.g., to a maximum level at beginning of life) with respect to otherwise possible storage capabilities. At later time during life in the depicted example, when the ECC protection level is increased (e.g., to ECC2 and then to ECC3, respectively requiring $P_1$ and $P_3$, and $P_1$, $P_3$ and $P_5$ parity cells, as depicted in FIG. 3), the payload quantity may be correspondingly reduced to free parity cells for use in storing parity data information. Line 401" of FIG. 4B represents the prior art average payload quantity, which is constant and always at a minimum level (e.g., $P_1$, $P_3$ and $P_5$ in case of ECC3, as depicted in FIG. 3), that is the nominal storage capacity, because the same (maximum) ECC protection level is used (e.g., ECC3), thus requiring the same (maximum) number of parity cells.

Figure 5A:
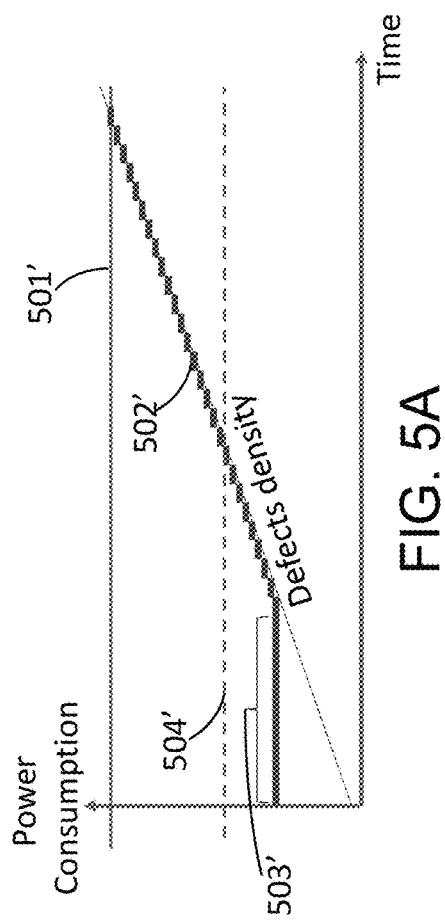
FIGS. 5A and 5B are graphs showing power consumption versus time and payload quantity versus time, respectively, as a result of techniques according to an embodiment of the present disclosure.
Figure 5B:
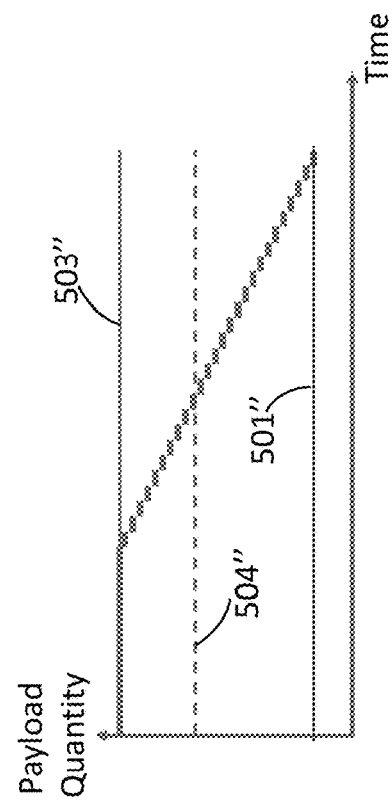

FIGS. 4A and 4B represent the behavior of a single portion (or generally of an array not divided into multiple portions), whereas FIGS. 5A and 5B represent a case in which the array is divided into multiple independent portions. As in FIG. 4A, line 501' of FIG. 5A represents the prior art average cost in terms of consumed power corresponding to the number of used parity cells, which is always at a maximum level. In the case of FIG. 5A, each step 502' corresponds to a single portion of the plurality of portions increasing its ECC protection level (different ECC correction capability may be independently selected for each portion), and plateau 503' represents an exemplary initial condition when all the portions have a minimum protection level (e.g., ECC1, even though a situation in which no ECC is initially implemented is possible). In this embodiment, the high granularity ensures better performances, as represented by line 504', which is the average power consumption, as compared with state of art represented by line 501'. Therefore, when increasing the granularity, smaller steps (corresponding to smaller portions) are possible, leading to a benefit increase. As shown in FIG. 5B, in a similar fashion as described with reference to FIG. 4B, when the ECC protection level is increased with time, the payload quantity is correspondingly reduced during the life of the memory, starting from an initial maximum available quantity (line 503"). In this case, smaller portions yield a significant benefit since the average available payload (represented by line 504") is much higher than state-of-art payload (which always corresponds to the minimum payload, line 501", constant during the whole life).

Figure 6:
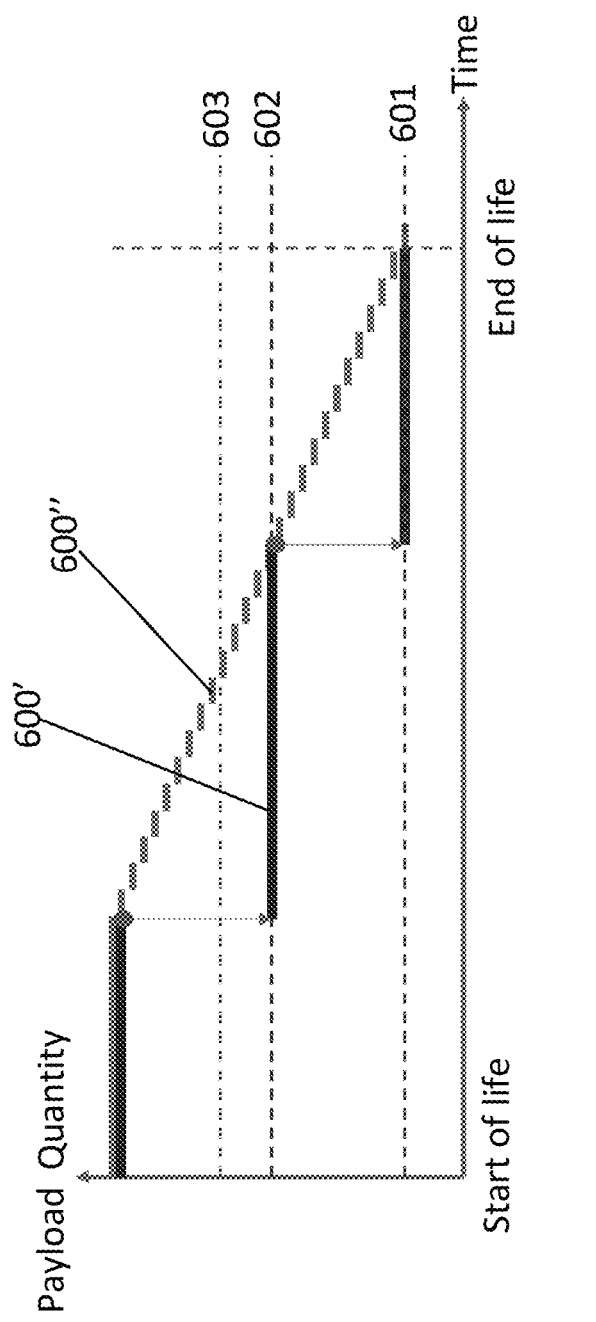
FIG. 6 is a comparison of payload quantity versus time as obtained according to different embodiments of the present disclosure.

FIG. 6 is a comparison of payload quantity versus time as obtained according to different embodiments of the present disclosure. The quantity of available payload using larger or smaller portions is shown, resulting in fewer but larger steps 600' and more but smaller steps 600", respectively. In FIG. 6, line 601 is the constant available payload with state-of-the-art technology, line 602 is the average available payload with larger portions, and line 603 is the average available payload with smaller portions. Therefore, increasing granularity (and thus using smaller portions) results in higher benefits in terms of average payload quantity, throughput and also power saving.

FIGS. 4A-4B, 5A-5B and 6 are examples showing a case in which the starting ECC protection level is low and then it is increased over time following the increase in defect density. It should be noted that, for improved graphical representation, the defect density or BER is depicted in FIG. 4A as a linearly increasing function with time (e.g., a line with positive slope). This is not the typical case and it is understood that any BER variation profile may be considered, linear or not. According to the disclosure, the ECC protection level or correction capability is varied or adjusted based on a variation of the BER (e.g., at any time when it is necessary to do so), therefore insuring the optimal usage of the ECC engine in any circumstance. Alternatively or additionally, depending on the technology, the starting ECC protection level may also be higher (e.g., ECC3) at a given moment in time, such as at start of life, and it could be decreased over time (e.g., to ECC2 and/or to ECC1), so that said graphs could also have a decreasing trend for the power consumption and an increasing trend for the payload quantity. Moreover, the trend does not need to be monotonous; in some cases, the BER may initially increase and subsequently decrease or vice-versa, so that the selected ECC correction capability and the associated number of parity cells needed to store the parity information may also vary with a waving trend in time for any portion—e.g., the device configuration is constantly optimized during its lifetime.

In any case, according to the present disclosure, the memory is configured so that the ECC correction capability and the payload quantity are varied (increased or decreased according to the specific technology) with the lifetime of the memory cells array based on the time-varying status thereof, which has many benefits in terms of power consumption.

According to an embodiment, data information relating to the selected ECC correction capability is stored in one or more dedicated non-volatile region(s) of the memory array. In other words, the array comprises a non-volatile region adapted to store the data information relating to the selected ECC correction capability, in particular the selected ECC protection level for each portion of the array. For example, with reference to FIG. 1, the non-volatile region dedicated to store said information may be the non-volatile region 107 of the memory section 101.

More in particular, when the array is subdivided into a plurality of portions, respective data information relating to the selected ECC correction capability for each portion is stored in the non-volatile region (which may be a single region or may also be subdivided into multiple regions of the array).

In an embodiment, this data information is then stored in a look-up table in which each portion of the array is associated with its respective selected ECC correction capability. The information about the ECC protection level of each portion can thus be transferred in this lookup table containing the information of all the memory portions and their current ECC protection level, which simplifies the reading of this information.

In an embodiment, the codeword itself may comprise the information indicating its current ECC protection level, leading to an extreme granularity. In this way, any specific codeword may be encoded with additional information bits associated thereto and relating to the selected ECC correction capability for said codeword. In this embodiment, more space of the array is required to store the information about the ECC protection level of each codeword, but the power benefits are increased.

Generally, several ways to manage different encoding of codewords in various portions are thus possible, the information relating to the ECC protection level of each portion being then stored in the array.

Figure 7:
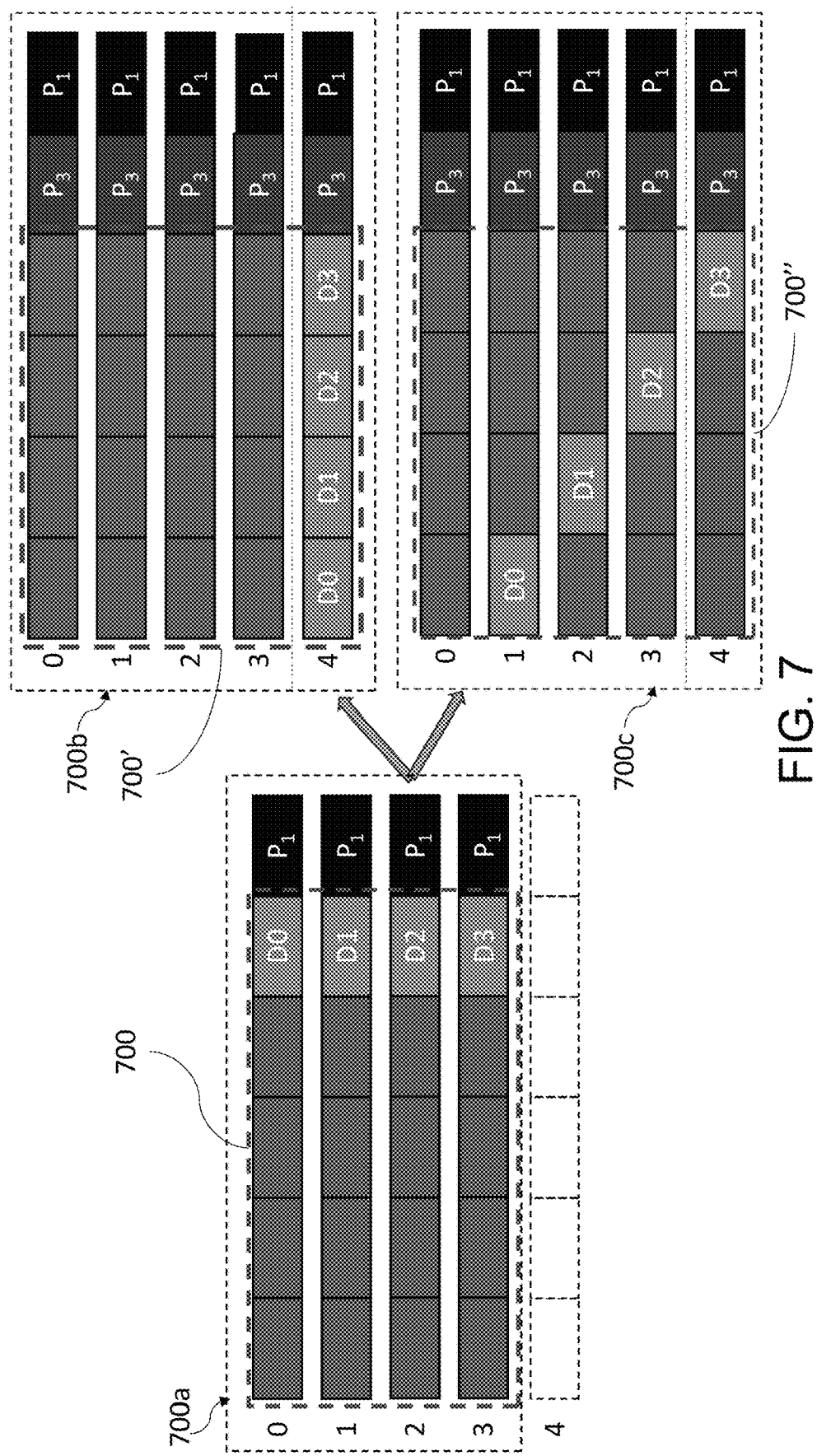
FIG. 7 shows examples of payload data relocation according to embodiments of the present disclosure.

As shown in FIG. 7, according to an embodiment of the present disclosure, at least part of the extra payload that is stored in the parity cells of one or more codewords is relocated in cells of one or more different codewords when the ECC correction capability is increased (and therefore when the number of stored parity bits in the original codeword—or in general of a given portion of the array—is increased). In fact, when the ECC protection switches to a higher level (for example due to an increase in defect density), the number of parity bits correspondingly increases so that extra payload data relocation is required and the payload initially stored in the parity cells is moved somewhere else, e.g., in other codewords of the array (e.g., in codewords in the same block). In this case, a page access may not return the same quantity of payload and more pages may be required to be accessed to obtain the same payload quantity. The data relocation is optimized if the memory portion comprises only full codewords.

As shown in FIG. 7, there are several possible relocation logic schemes starting from an initial configuration. In FIG. 7, the group of codewords 700a represents an exemplary initial configuration in which each codeword 0, 1, 2 and 3 initially has one group of parity cells $P_1$ (i.e., one or more parity cells) storing extra payload, which is indicated as D0, D1, D2 and D3, respectively. In this embodiment, the staring ECC protection level is ECC1, which is then increased to ECC2, as in cases described with reference to groups of codewords 700b and 700c having $P_1$ and $P_3$ parity bits. Other initial configurations are possible and the number of codewords involved is not limited to the one of the examples. Codewords 0, 1, 2 and 3 may be codewords of a single page.

More in particular, in an embodiment of the present disclosure, $P_3$ parity bits of respective codewords 0, 1 2 and 3 may be programmed in memory previously unused parity cells where for extra payload D0, D1, D2 and D3 was stored; the extra payload of codewords 700a (i.e., extra bits D0-D3) may be relocated in one or more new codewords (also having a same ECC correction capability, e.g., also having $P_1$ and $P_3$ parity bits, in the depicted example) and whose payload content is formed only by the relocated payload. In other words, according to example of the figure, all the relocated payload may be stored in codeword 4, as represented in case 700b, said codeword 4 being initially empty. This embodiment requires relatively small data relocation. In other words, in this example, the relocated payload is all stored in a one (or more, depending on the number of codewords in the group of codewords) new codeword comprising only the relocated extra payload.

In the depicted example, only parity cells necessary for either ECC1 ($P_1$ parity bits) or ECC2 ($P_1$ and $P_3$ parity bits) correction capability are described (e.g., no other parity cell is depicted). It is understood that such additional parity cells (e.g., configured to store parity information for an even higher ECC correction capability—for example, $P_5$ cells for an ECC3, which are not shown in the figure) may be present and may continue to store payload (e.g., payload in addition to nominal storage capacity) that in turn will possibly be relocated at a subsequent time, when the ECC protection level is further increased, reclaiming parity cells. In any case, the approach described above may be particularly beneficial when the memory portions (e.g., the groups of codewords) are configured and/or dimensioned so as to accommodate the relocated payload bits in a full codeword, or in an integer number of codewords or pages, for example.

In another embodiment, as shown in case 700c, different bits of the relocated payload (e.g., bits D0-D3) are stored in respective different codewords (also having a same increased ECC correction capability) according to a relocation sequence. In this case, the codewords housing the relocated payload comprise a mix of originally stored payload and part of the relocated extra payload (e.g., codewords 1, 2, 3, and 4 of group 700c), each of this extra payload bits being assigned a defined position in the respective codeword, in this way defining a sequence of relocated bits positions. In other words, different bits of the relocated payload are stored in single respective different codewords according to the relocation sequence, each relocated bit having its position in the respective codeword which may be different form the position of other relocated bits in other codewords. Also in the example depicted with reference to this approach, no mention of possible other parity cells is made. It is understood that, at intermediate ECC correction capability, memory cells (not shown) unused for higher ECC protection level may be used for partial additional payload storage and will be freed for storing parity information at a possible subsequent increase in ECC correction capability; relocation of the partial additional payload stored therein will be implemented, for example according to a second relocation sequence.

Generally, an internal reallocation buffer may be defined (indicated as 700 for group 700a, 700' for group 700b and 700" for group 700c), this buffer corresponding to the quantity of payload that can be reallocated and packed in an optimized way through the various configurations of ECC protection.

In the example of FIG. 7, the same quantity of payload is spread over four codewords in group 700a and it corresponds to five codewords in groups 700b and 700c. All groups are optimized because in group 700a four codewords are full and in groups 700b and 700c five codewords are full too. However, at system level, a bigger quantity of payload may be considered (for example an "external buffer"), so that the system does not access less than said external buffer quantity. This quantity may be different from the memory internal reallocation buffer dimension. When the external buffer is at least equal or a multiply of the internal reallocation buffer, embodiment 700a is preferred, since the system performs four sensing operations to get the desired payload (while in case of group 700b the system performs five sensing operations to get the same quantity of payload, corresponding to 20% access increase). The second embodiment 700c may be preferred when internal and external buffers have different dimensions (which generally leads to a worst performances), since the proper sequence is maintained in the case 700c.

According to an embodiment of the present disclosure, the adopted relocation scheme is stored in a look-up table which is used to reconstruct the proper data pattern according to the selected ECC protection level. Therefore, the change in the ECC protection level may correspond to a different available space or a different location of data, so that this table is used for a correct mapping of data as it contains the correspondence between the location of data bits and the selected ECC protection level. In other words, the logical to physical mapping table also accounts for the selected ECC correction capability properly considering the corresponding number of parity bits necessary for the ECC engine, and the relocation sequence for payload bits initially stored in unused parity cells (as well as additional payload possibly stored in parity cells still unused for parity information storage, if any).

In any case, the present disclosure is not limited by a particular relocation scheme, and FIG. 7 represents only exemplary embodiments, other schemes being therefore possible.

Moreover, according to an embodiment of the present disclosure, read and/or write access time to the memory cells of the array may be varied based on the number of parity cells used for storing the payload in codewords of a portion. In other words, the read and/or write access time to portions of the array is dynamically varied and adapted based on the selected ECC protection level of said portions.

When the ECC protection level is decreased (as it may be when the bit error rate is low, for example at the beginning of lifetime), the access to the same quantity of payload may require less time and less power consumption with respect to the conventional approach as it is possible to access (sense or program) less codewords for a given amount of data (since for instance part of payload bits have been or are stored in unused parity cells, as shown in FIG. 7), so that the memory throughput is increased. This advantage adds to the reduced energy consumption associated with less computation being performed by the less powerful ECC engine. The benefits persist even at intermediate ECC correction capability as described above. Performance is "reduced" to the prior art performance only when the ECC engine works at its highest correcting power (therefore also requiring all the allocated parity bits); in any case, the average performance is greatly improved, especially when a granular partitioning of the memory array is adopted.

Figure 8:
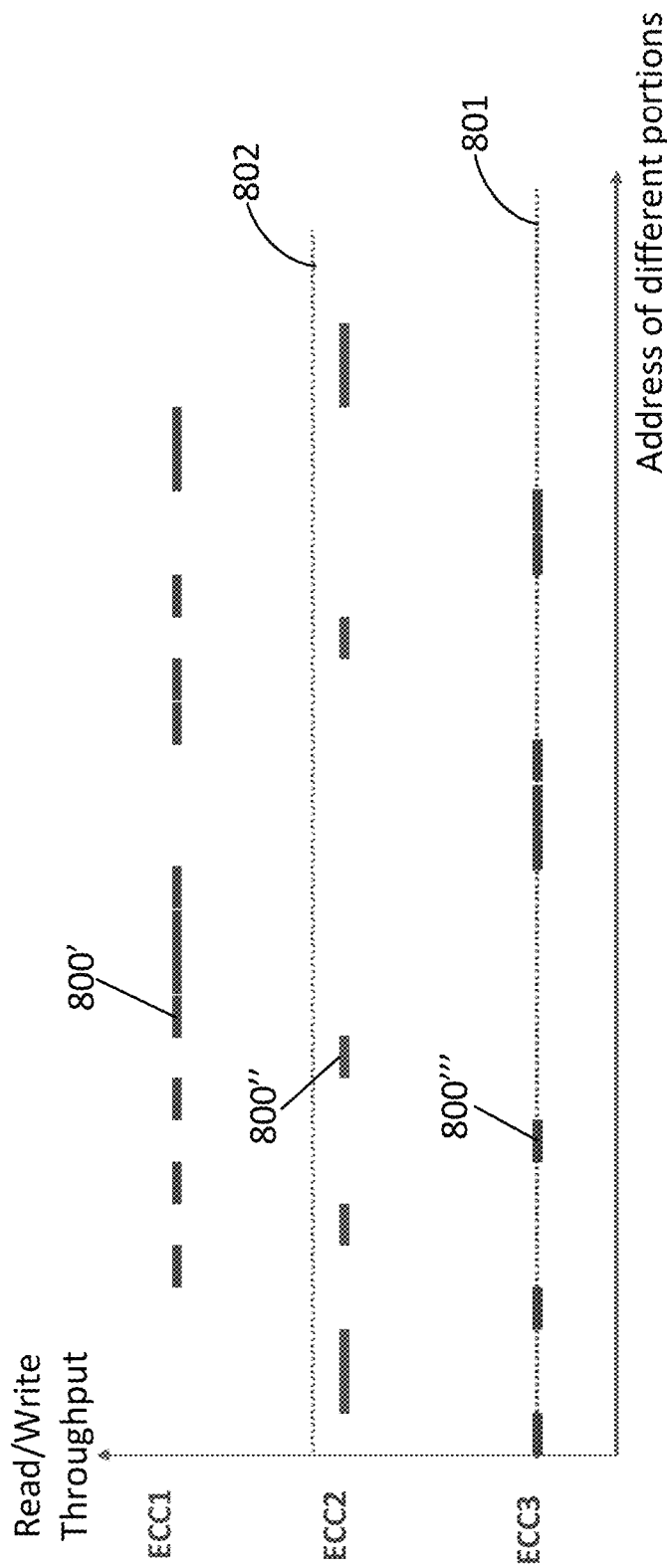
FIG. 8 shows different data throughputs based on the selected ECC protection level.

As shown before, the array may be divided into a plurality of portions which are represented in FIG. 8, showing, at a certain time, the throughput of different portions having different ECC protection levels, wherein in this graph each portion is identified by its address. More in particular, each portion (represented by segments 800' for portion having ECC1, segments 800" for portions having ECC2 and segments 800' for portions having ECC3) has a proper address which is represented by the position of segments 800'-800" with respect to the x-axis of the graph. In other words, in FIG. 8, each segment has a proper position along the x-axis corresponding to the specific address of the portions of the array, wherein each portion as a defined ECC protection level. Different regions of the memory have therefore different read/write throughputs.

The portions having a lower protection level have a higher payload content and therefore a higher throughput, e.g., the highest throughput is for portions with ECC1, as shown in FIG. 8. When ECC protection level is increased, throughput is decreased. As represented by line 801, the state-of-the-art techniques only provide for the highest protection level and therefore the lowest throughput. Line 802 is an exemplary average throughput at a certain time according to the dynamic payload approach of the present disclosure, which is higher compared to constant state of the art throughput of line 801.

In this case, a faster access time may be used for portions with higher throughputs, whereas a slower access time may be used for portions with lower throughputs, so that the average read/write access time may be optimized with respect to a case in which a constant access time is adopted. In other words, different portions having different addresses and different payload quantity may be accessed with different access times, leading to an even increased read/write throughput benefit. For example, a system controller or a user may rely on faster access times in portions protected by lower ECC correcting capability by selectively programming into those portions data that needs to be stored and/or retrieved more efficiently, e.g., with shorter latency.

Therefore, a variable read/write access time based on the selected ECC protection level of each portion leads to better performances and allows to best exploit all the potentialities of dynamic payload approach, so that the best fit is obtained with this dynamic read/write access time memory, i.e. with different packet access speed. The average throughput 802 thus corresponds to an average access time which may be much higher than the static payload case.

Figure 9:
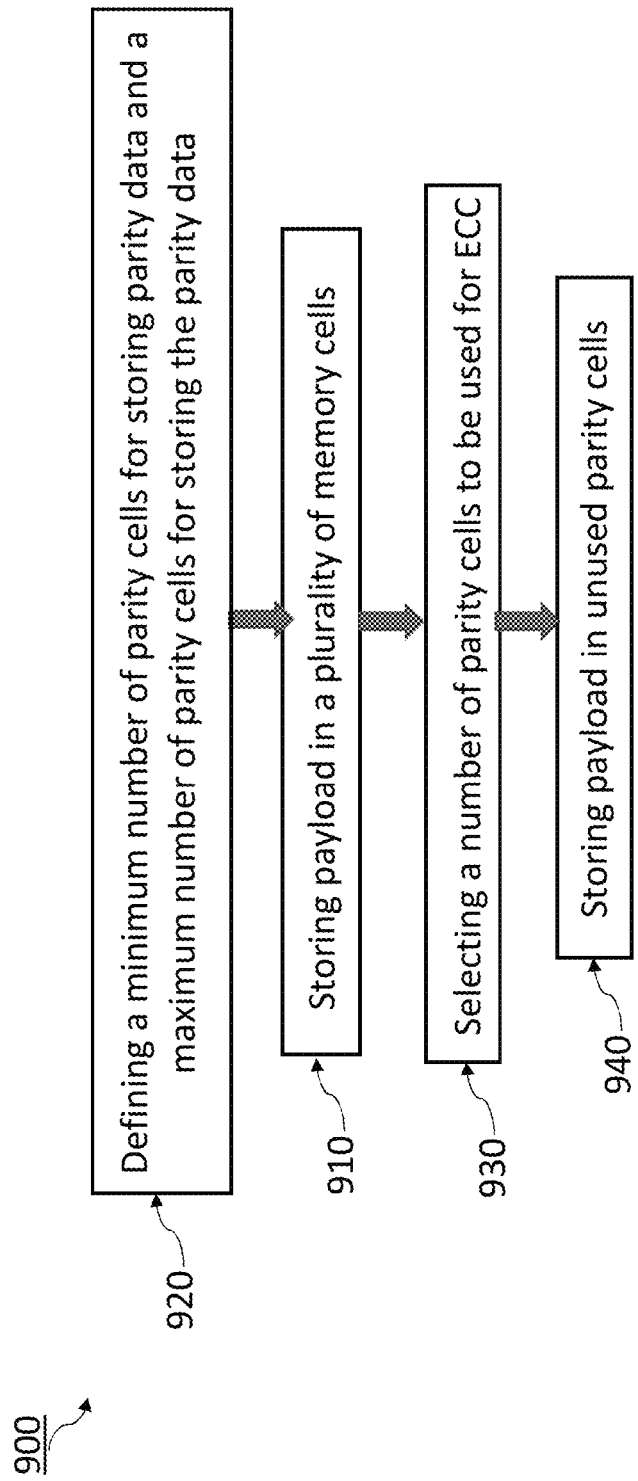
FIG. 9 is a flow diagram of steps of a method according to an embodiment of the present disclosure.

FIG. 9 a is flow diagram representing steps of a method 900 for operating an array of memory cells according to the present disclosure. The processes described can be performed by hardware logic and circuitry. For example, the following processes are described as being performed by access circuitry, sense circuitry and ECC circuitry, as disclosed herein. However, other embodiments can include different circuitry configurations suitable for performing the processes.

The method of the present disclosure is a method for improving the operation of memory cells having dynamic ECC protection. Access circuitry writes data to a plurality of memory cells. For example, access circuitry writes logic 0s and logic 1s to a plurality of memory cells such as the memory cells in the memory section 101 of FIG. 1. In one embodiment, access circuitry can write logic 0 by applying programming pulses with a negative polarity and logic 1 by applying programming pulses with a positive polarity. The opposite convention can also be adopted. After writing data to the plurality of memory cells, access circuitry can read the plurality of memory cells and ECC circuitry can verify the presence of errors and correct them.

More in particular, at step 910, a minimum number of parity cells for storing parity data and a maximum number of parity cells for storing the parity data may be defined. The parity data may then be associated to the payload. The minimum number of parity cells may correspond to a minimum ECC correction capability (for example, ECC1 or no ECC, respectively requiring $P_1$ parity cells or no parity cell at all), while the maximum number of parity cells may correspond to a maximum ECC correction capability (for example, ECC3, requiring $P_3$ parity cells). The minimum and maximum number of parity cells may be defined a priori and recalled at each write operation.

At step 920, payload content may be stored in a plurality of memory cells of a memory array, e.g., it is stored in a codeword.

At step 930, based on a current status of the memory cells, a number of parity cells to be used for storing the parity data is selected between the minimum number and the maximum number and stored in said selected number of cells.

Finally, at step 940 the payload is stored in at least part of the parity cells which are not selected to store parity data (e.g., parity cells that have been left empty of parity information). For example, parity memory cells unused for parity information may be used for storing payload bits.

In order to determine the status (i.e., the health) of cells of the array (or of a portion thereof), and thus to determine when (and how) the ECC protection level should be changed, several techniques or criteria may be implemented.

According to an embodiment, the triggering event may be provided by a counting unit, such as counting unit 106 of the exemplary memory device 100 of FIG. 1. More in particular, as disclosed with reference to the example of FIG. 1, the memory device 100 comprises the first counter 106', which may be configured to account for the lifetime of the memory cells. The first counter 106' is herein also referred to as cycle counter and is configured to count the occurrence of particular events of portions of the array.

In an embodiment, the first counter 106' is configured to count a number of accesses to the memory cells. However, the present disclosure is not limited to counting the accesses to the memory cells, and the first counter 106' may also be configured to count other events, such as a number of refresh events or a number of power-up events or a combination thereof. In any case, in this embodiment, the number of parity cells to be used for defining the proper ECC correction capability (and therefore the proper number of stored parity bits) is selected based on the value of the first counter 106'.

The first counter 106' may be a non-volatile counter accounting for the elapsed lifetime of memory cells, this information being maintained in the memory even after a switch off event thereof.

Figures 10A, 10B:
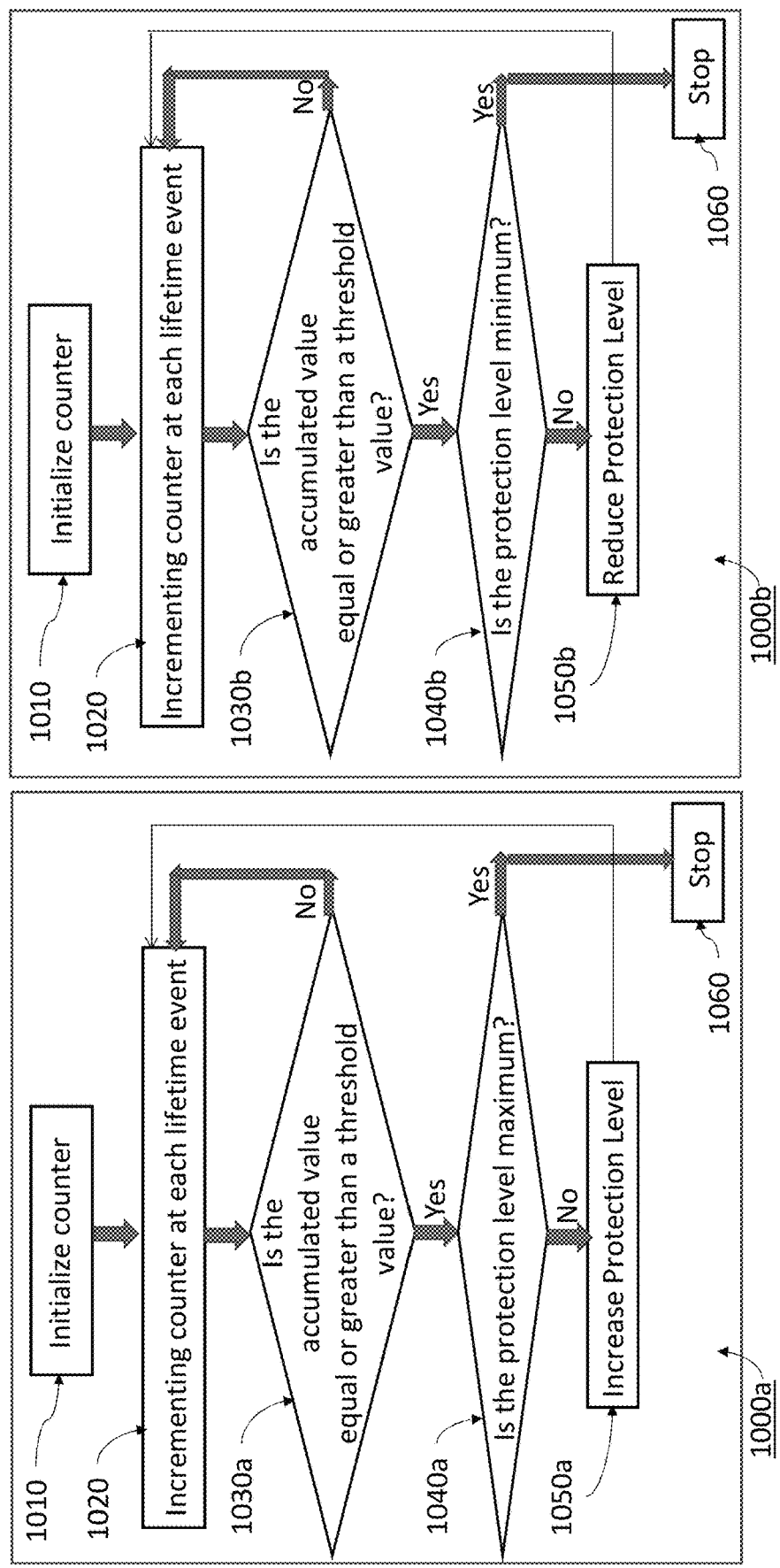
FIGS. 10A and 10B are flow diagrams representing techniques for selecting an ECC protection level based on a lifetime counter, according to different memory technologies.

FIGS. 10A and 10B are flow diagrams 1000a and 1000b for the selection of the ECC protection level based on the value of the first counter 106' (i.e., based on this lifetime counter). As mentioned before, a lifetime event may be an access to the cells of a portion, as well as many other events. More in particular, FIG. 10A represents a case 1000a in which the ECC protection level is increased during the life of the array, while FIG. 10B represents a case 1000b in which the ECC protection level is reduced during the life of the array (e.g., in case of memory technologies showing better performances after some cycles). In other words, ECC protection level can be increased or reduced depending on what is expected for a specific technology (which may be mapped in a dedicated Look-up table stored in the memory array). A mixed solution is also possible, in some cases (not shown).

More particularly, method 1000a may comprise: initializing the counter (step 1010), incrementing the counter at each lifetime event (step 1020), comparing the value of the first counter to a pre-set threshold value (step 1030a), and, when it is not equal to nor greater than this threshold value, continue from step 1020, while, when it is equal to or greater than this threshold value, checking if the protection level is maximum (step 1040a), and, if it is not, increasing the protection level (step 1050a), while, if the protection level is already at its maximum level, stop (step 1060).

Similarly, method 1000b may comprise: initializing the counter (step 1010), incrementing the counter at each lifetime event (step 1020), comparing the value of the first counter to a pre-set threshold value (step 1030b), and, when it is not equal to nor greater than this threshold value, continue from step 1020, while, when it is equal to or greater than this threshold value, checking if the protection level is minimum (step 1040b), and, if it is not, reducing the protection level (step 1050b) while, if the protection level is already at its minimum level, stop (step 1060).

Said differently, the ECC protection level is changed (e.g., increased or decreased) when a counter representative of the usage or lapsed lifetime meets a threshold value, as shown in FIGS. 10A and 10B. Therefore, in this embodiment, the first counter is apt to indicate the status of the memory cells (more particularly the status of the memory cells of the various portions, so that different counters may be implemented for corresponding different portions). For example, a specific counter is associated to a specific portion to trigger a variation of the specific ECC correction capability applied to the respective portions based on the specific usage of the respective memory cells. This technique to select the ECC protection level is herein referred to also as lifetime-based technique.

According to another embodiment of the present disclosure, the memory device comprises also a second counter, such as for example the second counter 106" of FIG. 1, which is configured to count a number of errors detected by the ECC, so that the EEC protection level decision is based on this error bit frequency counter.

As in the case of the first counter 106' (i.e. the non-volatile counter used for example to count the number of accesses), also the second counter 106" may be a non-volatile counter, in some examples.

More in particular, in this embodiment, the number of parity bits used for defining the proper ECC correction capability is selected based a counted error frequency, which is obtained as the ratio of the first counter 106' and the second counter 160" values.

Figure 11:
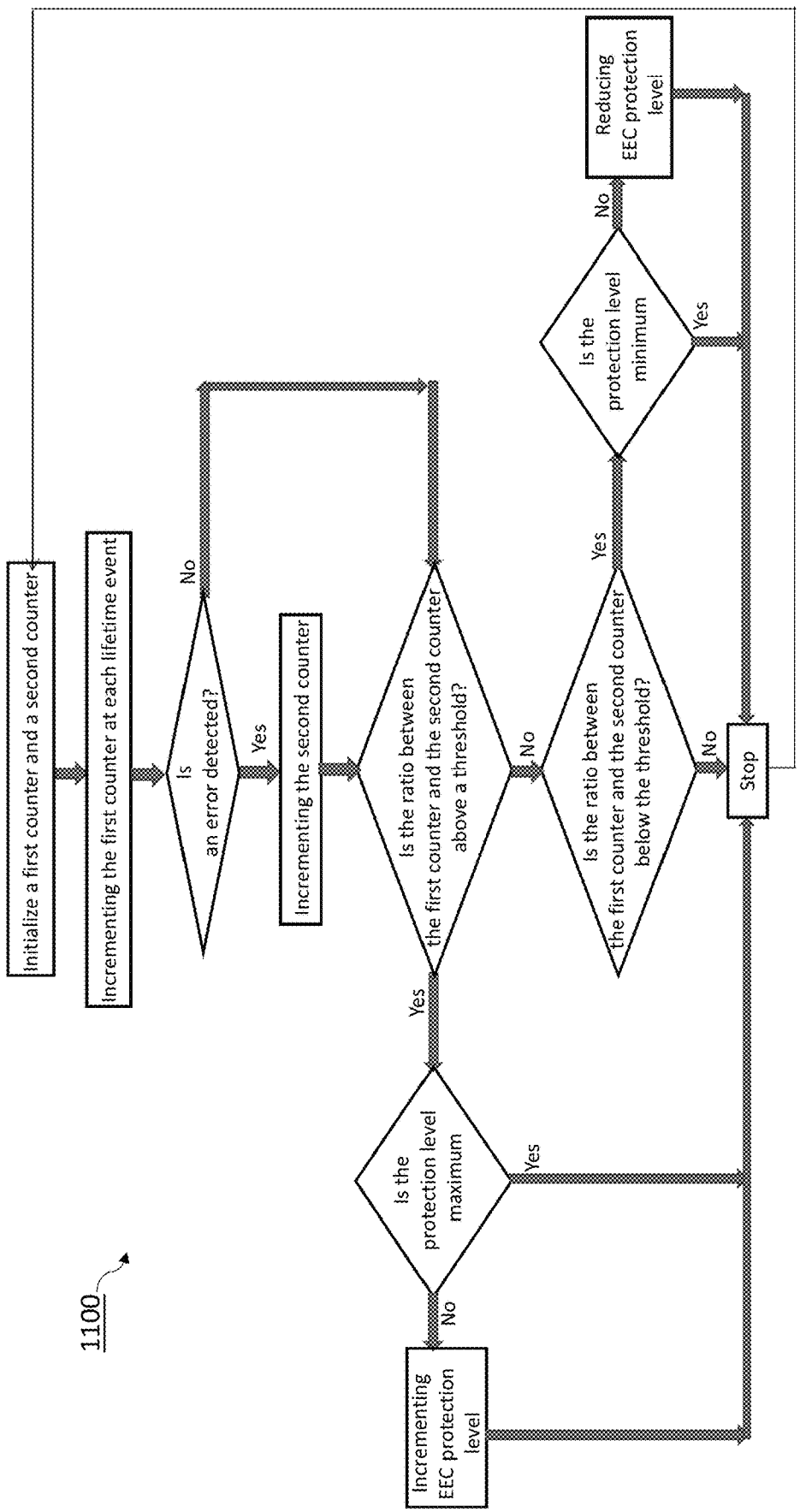
FIG. 11 is a flow diagram representing a technique for selecting the ECC protection level based on a counted error frequency.

FIG. 11 is flow diagram 1100 representing the selection of the ECC protection level based on the counted error frequency.

In particular, the value of the second counter 106" is incremented each time an error is detected by the current implemented ECC. Moreover, each time a lifetime event (e.g., an access) is counted by the first counter 106' (i.e., each time the first counter 106' is incremented), the ratio between the value of the first counter and of the second counter is calculated, yielding the error frequency. This ratio is then compared with a pre-set threshold value.

For example, when the error frequency is greater than the threshold value, the ECC level protection is increased, while when the error frequency is smaller than the threshold value, the ECC level protection is reduced, or vice versa depending on the specific adopted memory technology.

In other words, the number of parity cells used for defining the ECC protection level may be selected based the counted error frequency, which is obtained as the ratio of the content of the first counter and the second counter, the second counter being used to count the number of errors detected by the current ECC. Therefore, in this embodiment, the error frequency indicates the status of the memory cells. This technique to select the ECC protection level is herein referred to also as defectivity-based technique, and it is not limited by the error frequency detection only, and other measurements of defectivity can be used as shown below.

In an embodiment, the counted error frequency may be assigned a different weight depending on the number of errors (e.g. 1, 2 or 3) detected in a same codeword.

As mentioned before, according to the present disclosure, different portions are independently assigned a proper ECC protection level based on their status. Therefore, according to an embodiment, each portion may comprise one or more counter (e.g. the first counter and the second counter) for defining the status thereof. In this way, different counters are associated with different respective portions of the array, each counter being representative of a respective accumulated value (such as number of accesses, number of errors, etc.) for the respective portion, as disclosed above. The ECC protection level variation is thus performed on one or more portions in case the respective accumulated value is equal to or exceeds (or, in other embodiment, is lower than) a threshold value, as seen with reference to FIGS. 10A-10B and 11.

The counter(s) may also be updated by host or by internal sensors in order to count array time life, as it will disclosed below.

In any case, the present disclosure is not limited by a specific criterion to determine when the ECC protection level may be changed, and many other techniques are possible.

In some embodiments, a higher protection level may be selected based on an error count during an access operation. For example, detecting one additional error (e.g., with respect to the number of errors previously detected) may trigger an increase of ECC protection level to be applied. In a practical example, if no errors have ever been detected when accessing a codeword, an ECC1 protection level is appropriate (e.g., an ECC correction capability of one error); when an error is detected for the first time, the ECC protection level may be increased to provide ECC2 correction capability (correspondingly activating the additional parity cells as explained above with reference to FIGS. 3-7) in subsequent access operations. Similarly, when a second error is detected, the ECC protection level is further raised, for example to an ECC3 correction capability.

According to an embodiment, the initial status of the memory cells of the array may be defined during sort, e.g. via a testing machine used for evaluating process quality. In this case, the quality of at least one portion of the memory array is firstly tested by means of the testing machine; after the testing operation, the proper number of parity bits to be used for defining the required ECC correction capability is assigned to each portion of the array based on the performed quality test. In other words, testing evaluation may be used to assign a proper starting protection level for each portion.

FIG. 12 schematically shows separate portions (four of which are depicted) of a memory array subjected to a testing operation. The four separate portions may be independently tested and assigned a different starting ECC protection level after testing. In this way, during testing (sort), reset ECC level protection can be allocated depending on the physical characteristics of the die (e.g., silicon quality). For example, portion (0,0) may be assigned a starting ECC protection level Lvl 0 (that may correspond to a minimum ECC correction capability, for example ECC1 requiring $P_1$ parity cells); portion (0,y) may be assigned a starting ECC protection level Lvl 1 (that may correspond to an intermediate ECC correction capability, for example ECC2 requiring $P_1$ and $P_3$ parity cells); portion (x,0) may be assigned a starting ECC protection level Lvl 0 (e.g., ECC1); and portion (x, y) may be assigned a starting ECC protection level Lvl 3 (that may correspond to a maximum ECC correction capability, for example ECC4 requiring a corresponding number of parity cells), Other portions (not shown) may be assigned respective starting ECC protection levels. Then, during die life, the ECC correction capability may be assigned and varied for example as shown above with reference to FIGS. 10A-10B and 11.

Alternatively or additionally, according to other embodiments of the present disclosure, the number of parity cells to be used for defining the ECC correction capability is selected by the user.

The ECC protection level may also be selected based on signals of sensors coupled to the memory array, such as sensors included in sensing unit 108. In other words, still referencing to FIG. 1, the memory device comprises one or more sensors in the sensing unit 108 which are coupled to the memory section 101 and to the controller 102. The controller 102 may thus be configured to select the number of parity cells to be used for defining the ECC correction capability based on the signals from the sensing unit 108.

Moreover, according to another embodiment, the number of parity cells apt to be used for defining the ECC correction capability is selected based on sense amplifier margin measurement. In other words, the controller may be configured to select the protection level by using sense amplifiers, such as sense amplifiers of circuit portion 105 of FIG. 1.

In this embodiment, the protection level decision based on sensing with multiple reference ensures to precisely establish when the margin is getting too small. This approach can be adopted instead of error frequency detection. In this case, the flow diagram of FIG. 7 is substantially the same but the reset value of the ECC protection level can be no ECC instead of ECC1. In fact, since sense amplifiers can anticipate margin loss, the average ECC protection level can be reduced.

As mentioned before, the memory device can integrate a dedicated hardware, e.g. integrated in the ECC unit 104 of FIG. 1, to properly assign the ECC protection level to each portion of the array.

Summing up, changing the ECC protection level is based on several trigger events, such as internal sensors, conditions, detectors, special markets, process quality, counters, depending on the specific circumstance. For instance, special markets (such as automotive, space, etc.) may require a higher ECC protection.

The ECC unit is therefore programmed to ensure a tradeoff between simplicity and defectivity matching. FIGS. 13A and 13B show schematic exemplary graphs of the cost of the implemented ECC selection algorithm versus aging of the cells of the array. It should be noted that, despite aging is represented on the X-axis, the concepts herein disclosed are not limited to cost evolution vs. aging and, rather, they apply to whichever factor that may potentially affect the Bit Error Rate of the memory cells (e.g., lapsing time, cycling, endurance, exposure to high/low temperatures, hard/soft failure mechanisms, voltage drift, etc.; accordingly, aging is only one of many possible examples and the figures should be correspondingly broadly interpreted). As seen for FIGS. 4A and 4B, it is assumed that the defect density (and therefore the required ECC correction power) increases with aging, even if different situations may occur.

More in particular, with reference to FIG. 13A, line 1301' represents an estimated defectivity trend of the cells (based on a linear defectivity increase with aging, or other parameter), while steps 1302' represent the cost trend in terms of occupied area obtained by using a lifetime-based technique for selecting the ECC protection level (e.g., by counting the number of accesses, as generally depicted in FIGS. 10A and 10B). Such an algorithm is thus based an estimated defectivity trend (e.g., the estimated defectivity trend may be obtained by defining a threshold of number access or generally of lifetime events for switching ECC protection level). On the other hand, line 1303' represents the real defectivity trend of the memory and line 1304' represents the cost of an ECC technique as based on an actual measurement and not only on the estimate thereof (e.g., based on error frequency and/or sense amplifier margin measurements or the like). The operation is thus optimized if the technique used to select the ECC protection level is defectivity-based, which better adapts to the real trend.

With reference to FIG. 13B, lines 1301", 1302", 1303" and 904" corresponds to lines 901', 902', 903' and 904' of FIG. 9A, respectively. However, in this case, at graph portion 1305", the real defectivity trend is even worse than expected by the estimated linear scenario, so that a lifetime-based technique would yield a wrong operation of the memory, while a defectivity-based technique is able to follow the real defectivity trend with better average performances in terms of costs.

In other words, the ECC protection level is thus optimized if the algorithm used to program the controller and deciding the proper level is defectivity based and the defectivity trend is better than expected. The average cost in term of area/power/time is in fact reduced, as shown in FIG. 13A. Moreover, the ECC protection level can be too low if the defectivity is worse than expected, as shown in FIG. 13B, so that an adaptive algorithm (e.g. a technique based on error frequency, sense amplifier margin measurements etc.) optimizes the ECC protection level to the actual defectivity and improves reliability. Therefore, a proper protection level algorithm reduces average cost and improves reliability.

Depending on the particular application, a mix of some or even all the disclosed criteria to select the number of parity cells to be used may be chosen. For example, sensing with margin measurement may also be associated with error frequency measurement.

In conclusion, the present disclosure provides a selectable ECC correction capability of a plurality of memory cells by taking into account the evolution of characteristics of the array, instead of forcing the use of the maximum protection (i.e., instead of basing the ECC on end-of-life reliability which always uses the highest ECC protection level and uses all the memory cells dedicated to parity).

According to the present disclosure, the memory is programmed to dynamically adapt the stored payload content in a codeword or other memory section according to the selected (e.g., used) number of parity cells, so that when the ECC correction capability is varied over the lifetime of the memory cells based on the time-varying status thereof, the payload is correspondingly adapted to the varied number of parity cells used for parity information. Memory cells that are not used by parity bits can thus be used to store payload content. The storage of extra payload bits may be partial (for example only half of the unused cells may be used), or all the parity cells may be occupied by extra payload bits. In the context of this disclosure, "extra" or "additional" payload may comprise either or both the payload that would be otherwise be stored in different memory cells (e.g., memory cells at different physical address) and/or payload in actual excess of nominal storage capacity. In case of payload stored at different memory cells (e.g., in unused parity memory cells), there may be throughput and power-saving advantages, among others, when a relatively lower ECC correction capability is used, as described above. Payload stored in unused parity cells may be relocated on need, e.g., when higher ECC correction capability reclaims parity cells for storing an increased number of parity bits. Similarly, the storage capacity in excess of the nominal one may be available when an ECC correction capability lower than the maximum one is used (e.g., it may be a temporary boost of storage capability).

When ECC protection level is increased, scrambling of extra payload is possible. Several possible scrambling schemas are possible, including sequential shift, concentrated in free codeword, etc.

The ECC correction capability is thus variable over the lifetime of the array based on the time-varying status thereof, so that the ECC protection is adapted to the memory cells health, and the payload is adapted accordingly. According to embodiments of the present disclosure, the ECC protection level is adapted to the protection needs of specific portions of the array, which are independently managed. Portion dimensions may vary from the ECC codeword up to the die. In fact, a portion may correspond to an internal subdivision like a bank group, a bank, a section or whatever other internal subdivision, or may correspond to a specification/host subdivision like a buffer, a page, or may correspond to other beneficial dimensions. In any case, the smaller the portion, the higher the benefits in terms of power consumption.

Portion dimension may be optimized to fulfill a codeword when the ECC protection level is changed. Allowing for more granular portion allows for more benefits, such as more payload available, lower access time, higher throughput, as well as lower power consumption.

The ECC protection level is thus increased only when necessary, and the corresponding ECC hardware can be switched off.

The triggering events for switching the ECC protection level may be several and are not limited to a particular technique, which may vary with the memory technology.

According to an exemplary embodiment, a method for operating an array of memory cells comprises the steps of defining a minimum number of parity cells for storing parity data associated to the payload, the minimum number of parity cells corresponding to a minimum Error Correction Code (ECC) correction capability, defining a maximum number of parity cells for storing the parity data associated to the payload, the maximum number of parity cells corresponding to a maximum ECC correction capability, storing payload in a plurality of memory cells of a memory array, and, based on a current status of the memory cells, selecting a number of parity cells to be used for storing the parity data between the minimum number and the maximum number and storing parity data in said selected number of cells, wherein the payload is stored in at least part of the parity cells which are not selected to store parity data.

If not explicitly indicated, method steps are not necessarily in the disclosed sequence.

The present disclosure also relates to a memory device comprising an array including a plurality of memory cells and an operating unit of the array (e.g. a controller), wherein the operating unit is configured to define a minimum number of parity cells for storing parity data associated to the payload, the minimum number of parity cells corresponding to a minimum Error Correction Code (ECC) correction capability, define a maximum number of parity cells for storing the parity data associated to the payload, the maximum number of parity cells corresponding to a maximum ECC correction capability, store payload in a plurality of memory cells of the memory array, and, based on a current status of the memory cells, select a number of parity cells to be used for storing the parity data between the minimum number and the maximum number, wherein the operating unit is further configured to store the payload in at least part of the parity cells which are not selected to store parity data.

All the features disclosed above may be applied also to this exemplary memory device.

A related system, comprising a host device and a memory device as above is also disclosed, the system comprising for example any of a display communicatively coupled to the memory device or to the host, a network interface communicatively coupled to the memory device or to the host, and a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for operating an array of memory cells, comprising:
    defining a minimum number of parity cells of the array for storing parity data, the minimum number of parity cells corresponding to a minimum Error Correction Code (ECC) correction capability;
    defining a maximum number of parity cells of the array for storing the parity data, the maximum number of parity cells corresponding to a maximum ECC correction capability;
    storing payload in a plurality of memory cells of the array; and
    based on a current status of the memory cells, selecting a number of parity cells to be used for storing the parity data between the minimum number and the maximum number,
    wherein the payload is stored in at least part of the parity cells which are not selected to store parity data.

2. The method of claim 1, comprising dynamically adapting the stored payload in a codeword according to the selected ECC correction capability.

3. The method of claim 2, wherein the ECC correction capability is varied over the lifetime of the memory cells based on a time-varying status thereof, the payload being dynamically adapted to a varied number of parity cells used for storing the parity data.

4. The method of claim 1, comprising grouping the memory cells of the array into a plurality of portions, each portion of the plurality of portions being assigned a specific ECC correction capability based on the status of the memory cells thereof.

5. The method of claim 4, wherein a portion of the plurality of portions corresponds to one of a codeword, a bank, a bank group, a section of the array, the entire array, a buffer, and a page.

6. The method of claim 4, comprising storing respective data information relating to the selected ECC correction capability for each portion of the plurality of portions, the method further comprising storing in a look-up table said data information, wherein, in said look-up table, each portion of the array is associated with its respective selected ECC correction capability.

7. The method of claim 4, comprising dynamically adapting read and/or write access time to each portion of the array based on the number of parity cells used for storing the payload in codewords of said portions.

8. The method of claim 1, comprising storing data information relating to the selected ECC correction capability in at least one dedicated region of the memory array.

9. The method of claim 1, wherein a codeword is encoded with additional information bits associated thereto and relating to the selected ECC correction capability for said codeword.

10. The method of claim 1, comprising using a maximum number of memory cells for storing the payload when the number of parity cells used for storing the parity data is the minimum, and using a minimum number of memory cells for storing the payload when the number of parity cells used for storing the parity data is the maximum.

11. The method of claim 1, wherein at least part of the payload stored in the parity cells which are not used to store parity data of one or more codewords is relocated in cells of one or more different codewords when the number of stored parity bits in said one or more codewords is increased to increase the ECC correction capability thereof.

12. The method of claim 11, wherein the relocated payload is stored in one or more new codewords comprising only said relocated payload and corresponding parity bits, or
wherein different bits of the relocated payload are stored in respective different codewords according to a relocation sequence, wherein each respective different codeword comprises a mix of original payload and extra payload, the extra payload being assigned a specific position in the respective codeword based on said sequence.

13. The method of claim 1, wherein the number of parity cells to be used for defining the ECC correction capability is selected based on a value of a first counter used to count at least one of a number of accesses to the memory cells or a number of refresh events or a number of power-up events or a combination thereof, the value of the first counter indicating the status of the memory cells.

14. The method of claim 13, wherein the number of parity cells to be used for defining the ECC correction capability is selected based on a counted error frequency, the error frequency being based on the value of the first counter and a second value of a second counter, the second counter being used to count a number of errors detected by the ECC.

15. The method of claim 1, comprising:
testing the quality of at least one portion of the memory array by means of a testing machine; and
assigning to said at least one portion a proper number of parity cells to be used for defining the required ECC correction capability based on the performed quality test.

16. A memory device comprising:
an array including a plurality of memory cells; and
an operating unit of the array,
wherein the operating unit is configured to:
define a minimum number of parity cells for storing parity data, the minimum number of parity cells corresponding to a minimum Error Correction Code (ECC) correction capability;
define a maximum number of parity cells for storing the parity data, the maximum number of parity cells corresponding to a maximum ECC correction capability;
store payload in a plurality of memory cells of the array; and
based on a current status of the memory cells, select a number of parity cells to be used for storing the parity data between the minimum number and the maximum number,
wherein the operating unit is configured to store the payload in at least part of the parity cells which are not selected to store parity data.

17. The memory device of claim 16, wherein the array is divided into a plurality of portions, each portion of the plurality of portions being assigned a specific ECC correction capability based on the status of the memory cells of said portion.

18. The memory device of claim 17, wherein a portion of the plurality of portions corresponds to one of a codeword, a bank, a bank group, a section of the array, the entire array, a buffer, and a page.

19. The memory device of claim 17, wherein the operating unit is configured to store, for each portion of the plurality of portions, respective data information relating to the selected ECC correction capability, the operating unit being further configured to store in a look-up table said data information, wherein, in said look-up table, each portion of the array is associated with its respective selected ECC correction capability.

20. The memory device of claim 17, wherein different counters are associated with different respective portions of the array, each counter being representative of a respective accumulated value for the respective portion, the operating unit being configured to selectively perform the ECC correction capability variation on one or more portion based on the comparison of the respective accumulated value of the respective portion with a threshold value.

21. The memory device of claim 17, wherein the operating unit is configured to dynamically adapt read and/or write access time to each portion of the array based on the number of parity cells used for storing the payload in codewords of said portions.

22. The memory device of claim 16, wherein the array comprises at least one non-volatile region adapted to store data information relating to the selected ECC correction capability.

23. The memory device of claim 16, comprising a first counter configured to count at least one of a number of accesses to the memory cells or a number of refresh events or a number of power-up events or a combination thereof, wherein the number of parity cells to be used for defining the ECC correction capability is selected based on a value of the first counter.

24. The memory device of claim 23, comprising a second counter configured to count a number of errors detected by the ECC, the number of parity cells to be used for defining the ECC correction capability being selected based on an error frequency.

25. The memory device of claim 16, wherein a codeword stored in the array comprises respective additional information bits associated thereto and relating to the selected ECC correction capability for said codeword.

26. The memory device of claim 16, comprising:
a sensing unit coupled to the memory array, wherein the operating unit is configured to select the number of parity cells to be used for defining the ECC correction capability based on the signals of said sensing unit; and/or
sense amplifiers, wherein the operating unit is configured to select the number of parity cells to be used for defining the ECC correction capability based on sense amplifier margin measurement.

27. The memory device of claim 16, wherein the operating unit is configured to relocate at least part of the payload stored in parity cells which are not used to store parity data of at least one first codeword in cells of at least one different codeword when the number of stored parity bits in said at least one first codeword is increased to increase the ECC correction capability.

28. The memory device of claim 16, wherein the operating unit is a controller of the memory device, said controller comprising circuit portions configured to perform error correction on the payload according to the selected ECC correction capability, and wherein said controller is configured to activate different circuit portions according to the selected ECC correction capability.

29. The memory device of claim 16, wherein the controller is configured to store payload content in only a part of the parity cells which are not used to store parity data.

30. The memory device of claim 16, wherein the operating unit is configured to dynamically adapt the stored payload in a codeword according to the selected ECC correction capability, and wherein the ECC correction capability is varied over the lifetime of the memory cells based on the time-varying status thereof, the stored payload being adapted to the varied number of parity cells.

31. A system comprising:
a host device;
an array including a plurality of memory cells; and
an operating unit of the array,
wherein the operating unit is configured to:
  define a minimum number of parity cells for storing parity data, the minimum number of parity cells corresponding to a minimum Error Correction Code (ECC) correction capability;
  define a maximum number of parity cells for storing the parity data, the maximum number of parity cells corresponding to a maximum ECC correction capability;
  store payload in a plurality of memory cells of the array; and
  based on a current status of the memory cells, select a number of parity cells to be used for storing the parity data between the minimum number and the maximum number,
wherein the operating unit is configured to store the payload in at least part of the parity cells which are not selected to store parity data.

32. The system of claim 31, further comprising any of a display communicatively coupled to the memory device or to the host, a network interface communicatively coupled to the memory device or to the host, and a battery coupled to provide power to said system.

\* \* \* \* \*